(12) United States Patent
Kachare et al.

(10) Patent No.: US 11,809,799 B2
(45) Date of Patent: Nov. 7, 2023

(54) SYSTEMS AND METHODS FOR MULTI PF EMULATION USING VFS IN SSD CONTROLLER

(71) Applicant: Samsung Electronics Co., Ltd., Suwon-si (KR)

(72) Inventors: Ramdas P. Kachare, Pleasanton, CA (US); Stephen Fischer, San Jose, CA (US); Oscar P. Pinto, San Jose, CA (US)

(73) Assignee: SAMSUNG ELECTRONICS CO., LTD.

( * ) Notice: Subject to any disclaimer, the term of this patent is extended or adjusted under 35 U.S.C. 154(b) by 309 days.

(21) Appl. No.: 16/846,271

(22) Filed: Apr. 10, 2020

(65) Prior Publication Data

US 2020/0401751 A1 Dec. 24, 2020

Related U.S. Application Data

(60) Provisional application No. 62/865,962, filed on Jun. 24, 2019, provisional application No. 62/964,114, filed on Jan. 21, 2020.

(51) Int. Cl.
*G06F 30/39* (2020.01)
*G06F 30/392* (2020.01)
(Continued)

(52) U.S. Cl.
CPC .......... *G06F 30/392* (2020.01); *G06F 13/105* (2013.01); *G06F 13/4027* (2013.01);
(Continued)

(58) Field of Classification Search
CPC .. G06F 13/105; G06F 13/4027; G06F 30/392; G06F 30/347
See application file for complete search history.

(56) References Cited

U.S. PATENT DOCUMENTS 7,979,592 B1 * 7/2011 Pettey ................... G06F 13/404
709/205
10,394,746 B2 8/2019 Kachare et al.
(Continued)

FOREIGN PATENT DOCUMENTS

CN 106484492 A 3/2017
CN 109656473 A 4/2019

OTHER PUBLICATIONS

Chinese Office Action for Application No. 202010582886.0, dated Jun. 30, 2023.

*Primary Examiner* — Henry Tsai
*Assistant Examiner* — Christopher A Daley
(74) *Attorney, Agent, or Firm* — Renaissance IP Law Group LLP

(57) ABSTRACT

A Lightweight Bridge (LWB) is disclosed. The LWB may be a circuit. An endpoint of the LWB that may expose a plurality of Physical Functions (PFs) to a host. A root port of the LWB may connect to a device and determine the PFs and Virtual Functions (VFs) exposed by the device. An Application Layer-Endpoint (APP-EP) and an Application Layer-Root Port (APP-RP) may translate between the PFs exposed by the endpoint and the PFs/VFs exposed by the device. The APP-EP and the APP-RP may implement a mapping between the PFs exposed by the endpoint and the PFs/VFs exposed by the device.

20 Claims, 23 Drawing Sheets

(51) Int. Cl.
  *G06F 30/347* (2020.01)
  *G06F 13/10* (2006.01)
  *G06F 13/40* (2006.01)
  *G06F 15/17* (2006.01)

(52) U.S. Cl.
  CPC ............ *G06F 30/347* (2020.01); *G06F 13/10* (2013.01); *G06F 15/17* (2013.01)

(56) References Cited

U.S. PATENT DOCUMENTS

| | | |
|---|---|---|
| 10,719,474 B2 | 7/2020 | Kachare et al. |
| 2008/0147898 A1* | 6/2008 | Freimuth ............ G06F 13/4027 710/8 |
| 2011/0060859 A1* | 3/2011 | Shukla ................ G06F 9/45558 718/1 |
| 2014/0310430 A1* | 10/2014 | Geddes ................ G06F 13/426 710/313 |
| 2015/0032910 A1* | 1/2015 | Ben Yehuda ....... G06F 13/4221 710/15 |
| 2016/0154756 A1* | 6/2016 | Dodson .............. G06F 13/4022 710/316 |
| 2016/0306580 A1 | 10/2016 | Pinto |
| 2017/0212579 A1* | 7/2017 | Tirumala .................. G06F 5/14 |
| 2019/0114195 A1* | 4/2019 | Jani .................... G06F 13/4221 |
| 2021/0182212 A1* | 6/2021 | Borikar .................. G06F 12/12 |
| 2021/0349841 A1* | 11/2021 | Makhervaks ......... G06F 3/0664 |

\* cited by examiner

SYSTEMS AND METHODS FOR MULTI PF EMULATION USING VFS IN SSD CONTROLLER

RELATED APPLICATION DATA

This application claims the benefit of U.S. Provisional Patent Application Ser. No. 62/865,962, filed Jun. 24, 2019 and U.S. Provisional Patent Application Ser. No. 62/964,114, filed Jan. 21, 2020, both of which are incorporated by reference herein for all purposes.

FIELD

The inventive concepts relate generally to storage devices, and more particularly to emulating Peripheral Component Interconnect Express (PCIe) Virtual Functions (VFs) as PCIe Physical Functions (PFs).

BACKGROUND

Devices, such as Peripheral Component Interconnect Express (PCIe) devices, expose various functions that may be accessed by other components in a computer system. For example, the host processor may use such functions exposed by a Solid State Drive (SSD) to perform various operations within the SSD. These functions may operate on data stored on the SSD, or may operate on data provided by the host. Typically, the functions exposed by the devices relate to normal operations of the device, but no such limitation is required: for example, while SSDs are traditionally used to store data, if an SSD includes a processor that processor may be used to offload processing from the host processor.

The functions exposed by a device may be discovered by the host machine while enumerating the devices at startup (or when installed, if hot installation of devices is supported). As part of discovery, the host machine may query the device for any exposed functions, which may then be added to a list of available functions for the device.

Functions fall into two categories: physical and virtual. Physical functions (PFs) may be implemented using hardware within the device. Resources of the PFs may be managed and configured independently any other PFs offered by the device. Virtual functions (VFs) are lightweight functions that may be thought of as virtualized functions. Unlike PFs, a VF is typically associated with a particular PF, and typically shares resources with its associated PF (and possibly with other VFs associated with the PF as well).

Because PFs are independent of each other, and because VFs may require the use of Single Root Input/Output Virtualization (SR-IOV) for a host to access VFs, there is a preference for devices to expose PFs. But because PFs are independent, they may require separate hardware, increasing the space required within the device and the power consumed by the device. The SR-IOV protocol may impose complexity in the host system software stack, especially for the virtualization use cases.

A need remains to offer PFs for a device without imposing the cost requirements of PFs so that system software complexity can be reduced.

DETAILED DESCRIPTION

Figure 1:
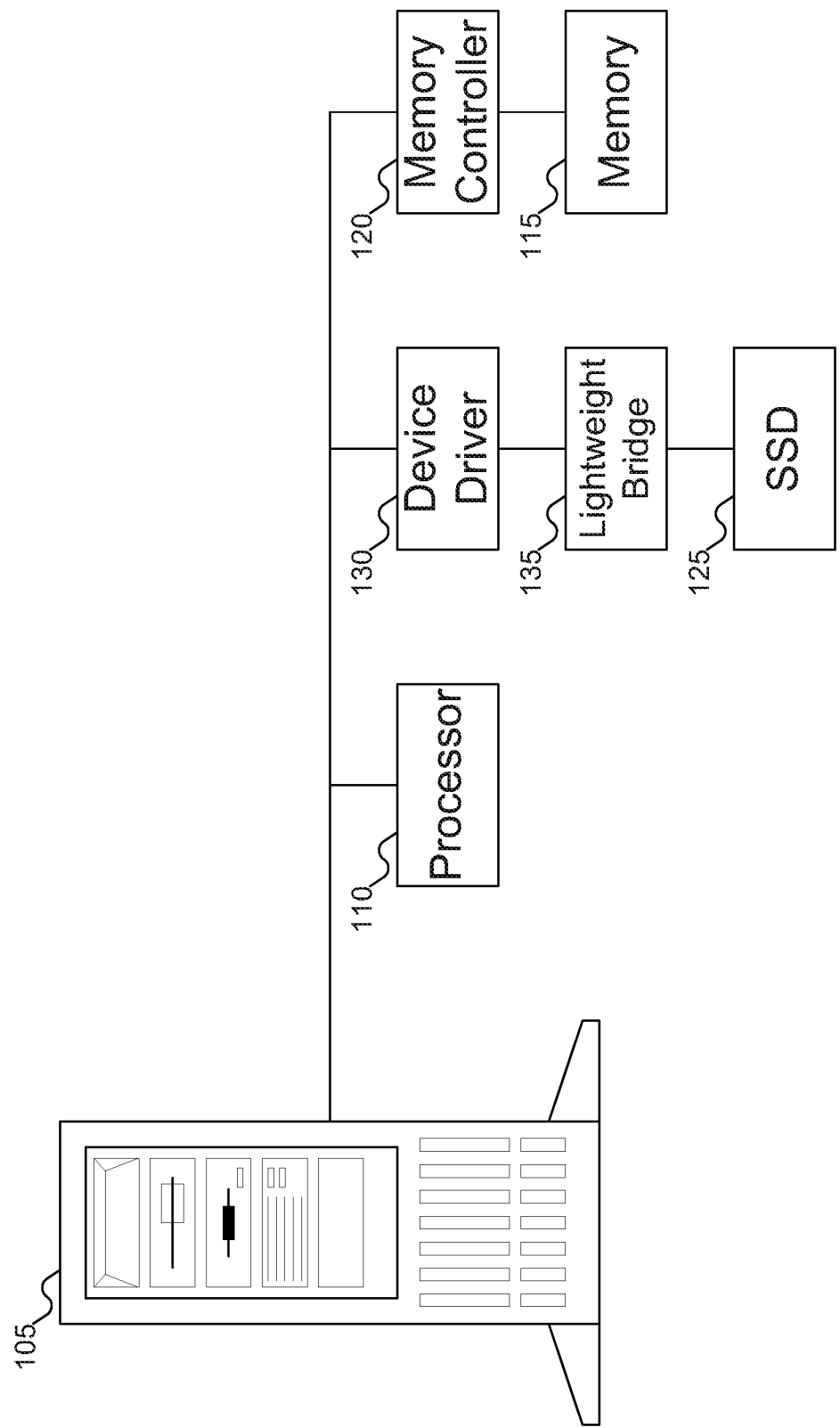
FIG. 1 shows a machine including a Lightweight Bridge (LWB) capable of emulating Physical Functions (PFs) exposed by the LWB using Virtual Functions (VFs) of a Solid State Drive (SSD), according to an embodiment of the inventive concept.

Reference will now be made in detail to embodiments of the invention, examples of which are illustrated in the accompanying drawings. In the following detailed description, numerous specific details are set forth to enable a thorough understanding of the invention. It should be understood, however, that persons having ordinary skill in the art may practice the invention without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the invention.

The terminology used in the description of the invention herein is for the purpose of describing particular embodiments only and is not intended to be limiting of the invention. As used in the description of the invention and the appended claims, the singular forms "a", "an", and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments of the inventive concept include a method and system of emulating multiple Physical Functions (PF) in a device, such as a Solid State Drive (SSD), using Virtual Functions (VF) supported by the device. An SSD may have multiple NVMe controllers represented by multiple PCIe Physical Functions (PFs) or PCIe Virtual Functions (VFs). Each PF or VF essentially presents an NVMe controller that may be used by a host NVMe driver to perform data storage functions. PFs have actual physical resources whereas Virtual Functions share the resources with PFs. Embodiments of the inventive concept may expose multiple PFs to the host using a set of VFs in an SSD controller. That is to say, multiple PFs may be emulated by the device and internally VFs may be used. For the host point of view, the host system software stack sees multiple PCIe PFs and NVMe controllers behind those PFs. Embodiments of the inventive concept may internally map and translate all the host accesses to the PFs to VFs.

PCIe PFs are independent of any other functions (physical or virtual). That is to say, the PFs have their own, dedicated physical resources such as memory buffers. For a device to support a large number of PFs, adds to the logic area, power consumption, and complexity of the underlying device. Thus, to reduce cost and complexity on the device side, PCIe specification offers support for Virtual Functions (VF). The VFs share physical resources with the PFs and are dependent upon PFs for all the physical aspects. These physical aspects include PCIe link control, device control, power management etc.

Although VFs lower the cost and complexity on the device side, VFs add to the complexity on the system software side. The system software needs to support Single Root Input/Output Virtualization (SR-IOV) protocol to be able to communicate with VFs. This added functionality at times lowers I/O performance in terms of extra latency. Thus, it is desirable to have PFs from the system software point of view.

Embodiments of the inventive concept allow the device to emulate PFs using VFs in the SSD controller. That is to say, from the host point of view the storage device SSD appears to have multiple PFs. But on the device side, those PFs may be emulated using a set of VFs. To reduce the cost, a lightweight bridge (LWB) may be used to expose the functions of a device such as an SSD without requiring the various functions to be implemented as PFs in a SSD Controller ASIC.

In an example implementation of a LWB, a total of 16 functions may be exposed by the LWB as though they were physical functions, even though the underlying device may implement some or most of the functions as VFs rather than PFs. The LWB acts as a bridge between the host machine and the SSD controller itself: the LWB may be implemented as part of the overall SSD device, or as a separate component. The device may be an SSD, with the functions (1 PF and 15 VFs) implemented as part of the endpoint of the SSD controller. (The SSD may also conventionally include a host interface layer (HIL), a flash translation layer (FTL), and flash controller (FC) to access flash memory.)

The LWB may communicate with the host machine using four lanes of a Gen3 PCIe bus, whereas inside the LWB communication may be implemented using 16 lanes of a Gen3 PCIe bus. But embodiments of the inventive concept may support using any particular version of the PCIe bus (or other bus types), and may support any desired speed or lanes or bandwidth without limitation, both with the host machine and internally. The PCIe lane widths and speed in this description are just examples and it is understood that any combinations may be implemented using the same concepts.

Instead of the SSD controller communicating with a root-port or root complex on the host machine, the SSD controller may communicate with a root port of the LWB. The SSD controller may be unaware of this change, and may treat communications coming from the root port of the LWB as though they were communications from the host machine. Similarly, the host machine may communicate with an endpoint of the LWB without knowing that the endpoint is not the SSD controller (which implements the exposed functions). As far as either the SSD controller or the host machine are concerned, the party with whom they communicate (in embodiments of the inventive concept, the LWB) may be viewed as a black box.

The endpoint of the LWB may expose the same number of functions as the endpoint of the SSD controller. But instead of some of these functions being exposed as VFs, the endpoint of the LWB may expose all the functions as PFs. The LWB may also include a PCIe Application Layer for Endpoint (PAPP-EP) and a PCIe Application Layer for Root Port (PAPP-RP). The PAPP-EP and PAPP-RP may manage the mapping from the PFs, as exposed by the endpoint of the LWB, to the functions (physical or virtual) as exposed by the endpoint of the SSD controller. The PAPP-RP may include a configuration translation table to assist in managing mapping of PCIe Configuration Space of the PFs exposed to the host to the PCIe Configuration Space of the PFs and/or VFs of the SSD Controller EP. This table may also indicate which PF exposed by the LWB endpoint maps to which function exposed by the SSD controller endpoint, as well as other information pertinent to the mapping (for example, what addresses in the SSD controller may store data for the exposed functions). The PCIe configuration features and capabilities offered by the endpoint of the LWB may (and often do) vary from those offered by the endpoint of the SSD controller: the configuration translation table may help in managing these differences. The PAPP-RP may also handle translation of memory base address register (BAR) addresses of PFs exposed to the host and the BARs of the PFs and/or VFs of the SSD Controller EP. The PAPP-EP and/or PAPP-RP may also include other tables, as needed. The mapping of host exposed PFs and SSD Controller internal PFs/VFs may be flexible and dynamic in nature. The mapping may be changed during runtime based on certain events and or policy changes issued by the management entity such as host and/or Board Management Controller (BMC). Some examples of these events are Virtual Machine (VM) migration, changes in SLA, power/performance throttling, date, time etc.

While the PAPP-EP and PAPP-RP may be separate components in some embodiments of the inventive concept, other embodiments of the inventive concept may implement these components (and potentially the endpoint, the root port, and the configuration manager of the LWB) in a single implementation. For example, the LWB may be implemented using either a Field Programmable Gate Array (FPGA) or an Application-Specific Integrated Circuit (ASIC) (which are only two examples of possible implementations). The PAPP-EP and PAPP-RP may communicate using any desired mechanism. For example, an intermediate data format may be defined that may be used to exchange data between the PAPP-EP and the PAPP-RP to invoke specific functions and return results.

The LWB may also include a configuration manager. The configuration manager may enumerate the functions (both PF and VF) offered by the endpoint of the SSD controller. The configuration manager may then use the information both to "define" the functions exposed by the endpoint of the LWB and to help construct the configuration space translation table in the PAPP-RP. In general, the configuration manager is used primarily during start up. But the host machine may change the PCIe Configuration Space of the PFs such as interrupts used for communicating with the endpoint (of the LWB) about the various functions, or the host machine may enable or disable a particular function. The configuration manager may be used to assist in making these changes as needed. The LWB may also need to ensure that similar PCIe Configuration space changes are propagated to the SSD controller as appropriate. That is to say that the LWB performs PCIe Configuration mirroring between the PFs exposed to the host and the PFs/VFs exposed by the internal SSD Controller EP. Thus, the LWB may also manage the functions exposed by the SSD controller.

Because there are two endpoints in the overall device (one in the LWB, one in the SSD controller), each maintains its own configuration space. These configuration spaces should be synchronized to avoid potential problems or conflicts. When the host sends a configuration write command, the LWB may update the configuration space in the LWB endpoint. The configuration write command may also be forwarded to the endpoint of the SSD (via the PAPP-EP, the PAPP-RP, and the root port), so that the endpoint of the SSD controller may also be updated. Not all host initiated configuration write commands may be reflected to the SSD controller. That is to say, some of the host configuration space changes may not be reflected as is to the backend SSD controller. For example, the host may make a power management change to the LWB EP, however that or similar change may not be done to the SSD controller EP by LWB.

When the host sends a configuration read command, that command may be satisfied by the endpoint of the LWB. The endpoint of the LWB may forward the configuration read command to the PAPP-EP, but the PAPP-EP may terminate the command: as the two configuration spaces are synchronized, the data in each configuration space should be the same. (Alternatively, the endpoint of the LWB may respond to the configuration read command and terminate the command at that point, without forwarding the configuration read command to the PAPP-EP.)

When the LWB receives memory read or write transactions (either from the host via the endpoint of the LWB or from the SSD controller via the root point of the LWB), the LWB may forward the transactions to the other party (host or SSD controller, as appropriate). The LWB may perform appropriate address translations using BAR tables in PAPP-EP and/or PAPP-RP. One example of such address translation for the transaction received from host is that the PAPP-EP may subtract the PF BAR from the received address and the PAPP-RP may add the VF BAR to that address to arrive at the correct address in the SSD controller.

Embodiments of the inventive concept may also include an optional intermediary element between the PAPP-EP and the PAPP-RP, which may be used for mapping, bandwidth control, etc. This optional element may also be used to variably "throttle" bandwidth for a number of reasons. For example, different functions exposed by the endpoint of the LWB may have different Quality of Service (QoS) requirements or Service Level Agreements (SLAs). A PF that has a low bandwidth QoS may be throttled to ensure that there is sufficient bandwidth for a PF that has a higher QoS bandwidth requirement. Other reasons for throttling bandwidth may include power or temperature. The LWB may be used to perform bandwidth throttling on a per PF basis or it could do bandwidth throttling for all the PFs based on configuration setting or policy set of the management entity such as host and/or BMC. The temperature or power throttling decisions may be based on two thresholds, high_limit and low_limit. When power usage or temperature exceeds high_limit, bandwidth throttling may be applied to all the PFs or selective PFs based on policy. The bandwidth throttling may be applied until the power or temperature drops below respective low_limit threshold.

In the above example embodiment of the inventive concept, the endpoint of the SSD controller is described as offering 1 PF and 15 VFs, which may be mapped to 16 different PFs at the endpoint of the LWB. These numbers are arbitrary: the endpoint of the SSD controller may offer any number of PFs and VFs, which may map to 16 PFs on the endpoint of the LWB, or more or fewer PFs.

If needed, VFs on the SSD controller may be migrated as appropriate within the LWB, with any appropriate changes made within the LWB and/or the SSD controller. Thus, the mapping from the PFs exposed by the endpoint of the LWB to the functions exposed by the SSD controller may be modified at run-time, and therefore is flexible.

Communication internal to the LWB may be done using any desired technique. For example, information exchanged between the endpoint, the PAPP-EP, the PAPP-RP, and the root port may use the transaction level packet (TLP) protocol.

The device itself may be of any form factor. For example, SSDs may be packaged using U.2 or Full Height, Half Length (FHHL) form factors, among other possibilities. Other types of devices may similarly be packaged in any desired form factor.

In another embodiment of the inventive concept, multiple SSD controllers may be included, each offering any number of functions: for example, each SSD controller may offer a total of 8 functions. Coupled between the endpoint of the LWB may be a multiplexer/demultiplexer which may direct data relating to a particular exposed PF to the appropriate PAPP-EP/PAPP-RP/root port/SSD controller for eventual execution. In this manner, a single LWB may expose more functions than might be offered by a single SSD controller.

Each SSD controller may communicate with a separate root port in the LWB, each with its own slice consisting of PAPP-EP, PAPP-RP, and configuration translation table. In this manner, operations involving one SSD controller may not have an impact internally to the LWB on operations involving another SSD controller.

Embodiments of the inventive concept such as this may be used, for example, when an endpoint on a single SSD controller does not satisfy all the requirements of the host machine. For example, if the SSD controller supports only 8 PCIe lanes but the host wants to support the bandwidth of 16 lanes, multiple SSD controllers may be used to support the required bandwidth. Or if the SSD controller only supports eight functions total and the host wants support for 16 functions, multiple SSD controllers may be used to supply the required function set. That is to say, the LWB may be used to connect any number of SSD Controllers using appropriate number of PAPP-EP/PAPP-RP/RP slices to the host as a single multi-function PCIe storage device.

As with other embodiments of the inventive concept, the numbers used are exemplary and not limiting. Thus, the endpoint of the LWB may use any type of bus, any version of that bus, and any number of lanes on that bus; the endpoint of the LWB may expose any number of PFs; the number of PFs exposed by each SSD controller may vary; the internal bus type, version, and speed may vary, as may the connection to the SSD controllers (which may also vary individually); the number of SSD controllers connected to the LWB may vary (and may connect to different or the same route points in the LWB); and so on.

FIG. 1 shows a machine including a Lightweight Bridge (LWB) capable of emulating Physical Functions (PFs) exposed by the LWB using Virtual Functions (VFs) of devices, according to an embodiment of the inventive concept. In FIG. 1, machine 105, which may also be termed a host, is shown. Machine 105 may include processor 110. Processor 110 may be any variety of processor: for example, an Intel Xeon, Celeron, Itanium, or Atom processor, an AMD Opteron processor, an ARM processor, etc. While FIG. 1 shows a single processor 110 in machine 105, machine 105 may include any number of processors, each of which may be single core or multi-core processors, and may be mixed in any desired combination.

Machine 105 may also include memory 115. Memory 115 may be any variety of memory, such as flash memory, Dynamic Random Access Memory (DRAM), Static Random Access Memory (SRAM), Persistent Random Access Memory, Ferroelectric Random Access Memory (FRAM), or Non-Volatile Random Access Memory (NVRAM), such as Magnetoresistive Random Access Memory (MRAM) etc. Memory 115 may also be any desired combination of different memory types. Machine 105 may also include memory controller 120, which may be used to manage access to memory 115.

Machine 105 may also include Solid State Drive (SSD) 125. SSD 125 may be used to store data, and may expose both Physical Functions (PFs) and Virtual Functions (VFs) for use by processor 110 (and software executed thereon) to invoke various capabilities of SSD 125. While FIG. 1 shows SSD 125, embodiments of the inventive concept may include devices of any type that offer PFs and VFs. For example, other types of storage devices, such as hard disk drives, that offer PFs and VFs may be used in place of SSD 125, as may devices that offer base functionalities other than data storage. In the remainder of this document, any reference to SSD 125 is intended to include reference to devices of other types that may offer PFs/VFs. In some embodiments of the inventive concept, SSD 125 may use connect to a Peripheral Component Interconnect Express (PCIe) bus and offer PCIe PFs and VFs, but embodiments of the inventive concept may use other interfaces. Processor 110 may run device driver 130, which may support access to SSD 125.

Situated in between SSD 125 and the rest of machine 105 may be Lightweight Bridge (LWB) 135. LWB may act as a bridge between SSD 125 and the rest of machine 105, and may expose the functions of SSD 125, but as PFs instead of VFs.

Although FIG. 1 depicts machine 105 as a server (which could be either a standalone or a rack server), embodiments of the inventive concept may include machine 105 of any desired type without limitation. For example, machine 105 could be replaced with a desktop or a laptop computer or any other machine that may benefit from embodiments of the inventive concept. Machine 105 may also include specialized portable computing machines, tablet computers, smartphones, and other computing machines. In addition, an application that may be accessing data from SSD 125 may located in another machine, separate from machine 105 and accessing machine 105 via a network connection traversing one or more networks of any types (wired, wireless, global, etc.).

Figure 2:
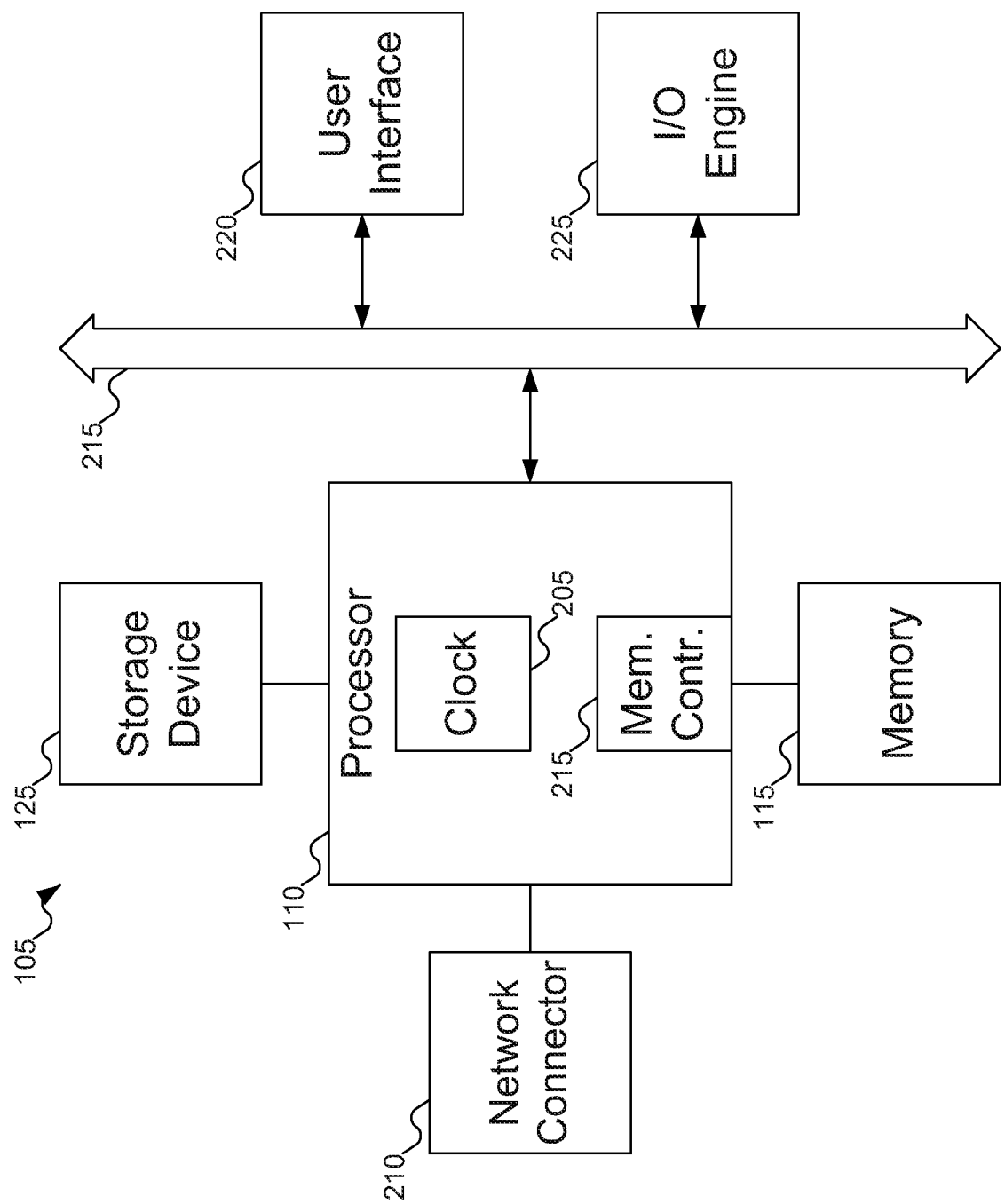
FIG. 2 shows additional details of the machine of FIG. 1.

FIG. 2 shows additional details of machine 105 of FIG. 1. In FIG. 2, typically, machine 105 includes one or more processors 110, which may include memory controllers 120 and clocks 205, which may be used to coordinate the operations of the components of device 105. Processors 110 may also be coupled to memories 115, which may include random access memory (RAM), read-only memory (ROM), or other state preserving media, as examples. Processors 110 may also be coupled to storage devices 125, and to network connector 210, which may be, for example, an Ethernet connector or a wireless connector. Processors 110 may also be connected to buses 215, to which may be attached user interfaces 220 and Input/Output interface ports that may be managed using Input/Output engines 225, among other components.

Figure 3:
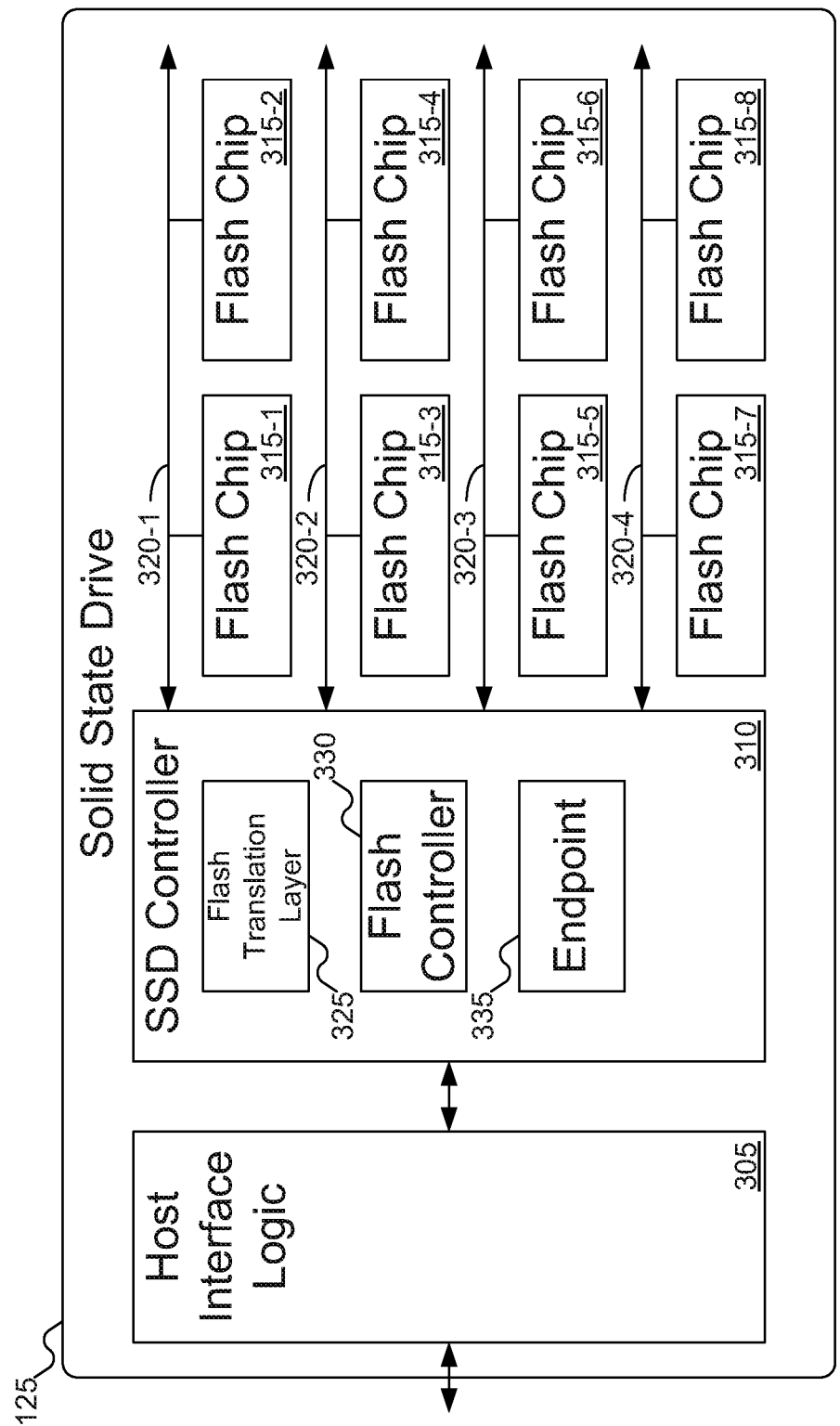
FIG. 3 shows details of the SSD of FIG. 1.

FIG. 3 shows details of SSD 125 of FIG. 1. In FIG. 3, SSD 125 may include host interface logic (HIL) 305, SSD controller 310, and various flash memory chips 315-1 through 315-8 (also termed "flash memory storage"), which may be organized into various channels 320-1 through 320-4. Host interface logic 305 may manage communications between SSD 125 and other components (such as processor 110 of FIG. 1 and LWB 135 of FIG. 1) Host interface logic 305 may also manage communications with devices remote from SSD 125: that is, devices that are not considered part of device 105, but in communication with SSD 125: for example, over one or more network connections. These communications may include read requests to read data from SSD 125, write requests to write data to SSD 125, and delete requests to delete data from SSD 125. Host interface logic 305 may manage an interface across only a single port, or it may manage interfaces across multiple ports. Alternatively, SSD 125 may include multiple ports, each of which may have a separate host interface logic 305 to manage interfaces across that port. Embodiments of the inventive concept may also mix the possibilities (for example, an SSD with three ports might have one host interface logic to manage one port and a second host interface logic to manage the other two ports).

SSD controller 310 may manage the read and write operations, along with garbage collection and other operations, on flash memory chips 315-1 through 315-8 using a flash memory controller (not shown in FIG. 3). SSD controller 310 may include flash translation layer 325, flash controller 330, and endpoint 335. Flash translation layer may manage the mapping of logical block addresses (LBAs) (as used by host 105 of FIG. 1) to physical block addresses (PBAs) where the data is actually stored on SSD 310. By using flash translation layer 325, host 105 of FIG. 1 does not need to be informed when data is moved from one block to another within SSD 125.

Flash controller 330 may manage the writing of data to flash chips 315-1 through 315-8, and the reading of data therefrom. Endpoint 335 may act as an endpoint for SSD 125, which may be connected to a root port on another device (such as host 105 of FIG. 1 or LWB 135 of FIG. 1).

While FIG. 3 shows SSD 125 as including eight flash memory chips 315-1 through 315-8 organized into four channels 320-1 through 320-4, embodiments of the inventive concept may support any number of flash memory chips organized into any number of channels. Similarly, while FIG. 3 shows the structure of a SSD, other storage devices (for example, hard disk drives) may be implemented using a different structure, but with similar potential benefits.

Figure 4A:
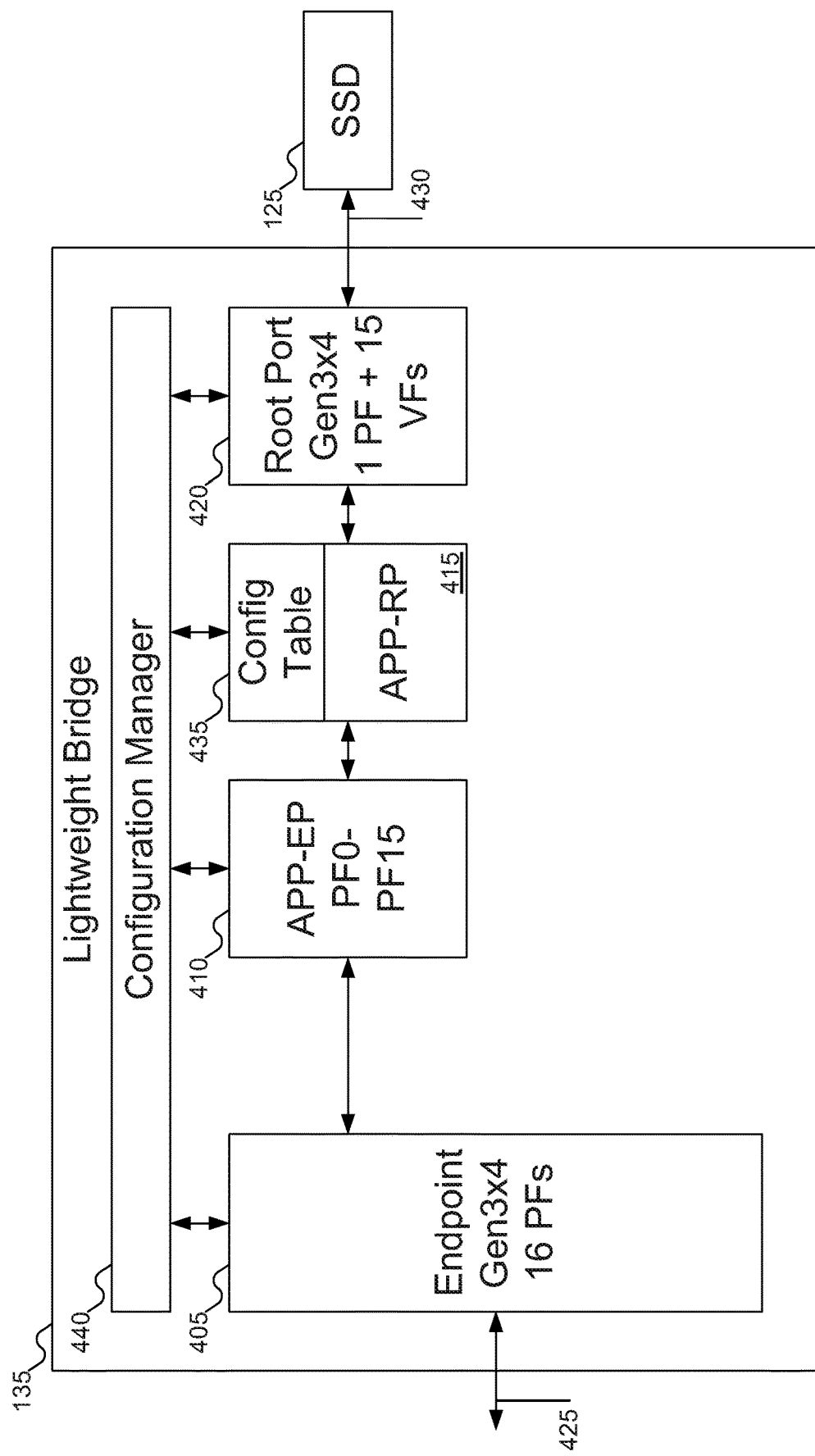
FIGS. 4A-4C show the LWB of FIG. 1 according to various embodiments of the inventive concept.
Figure 4B:
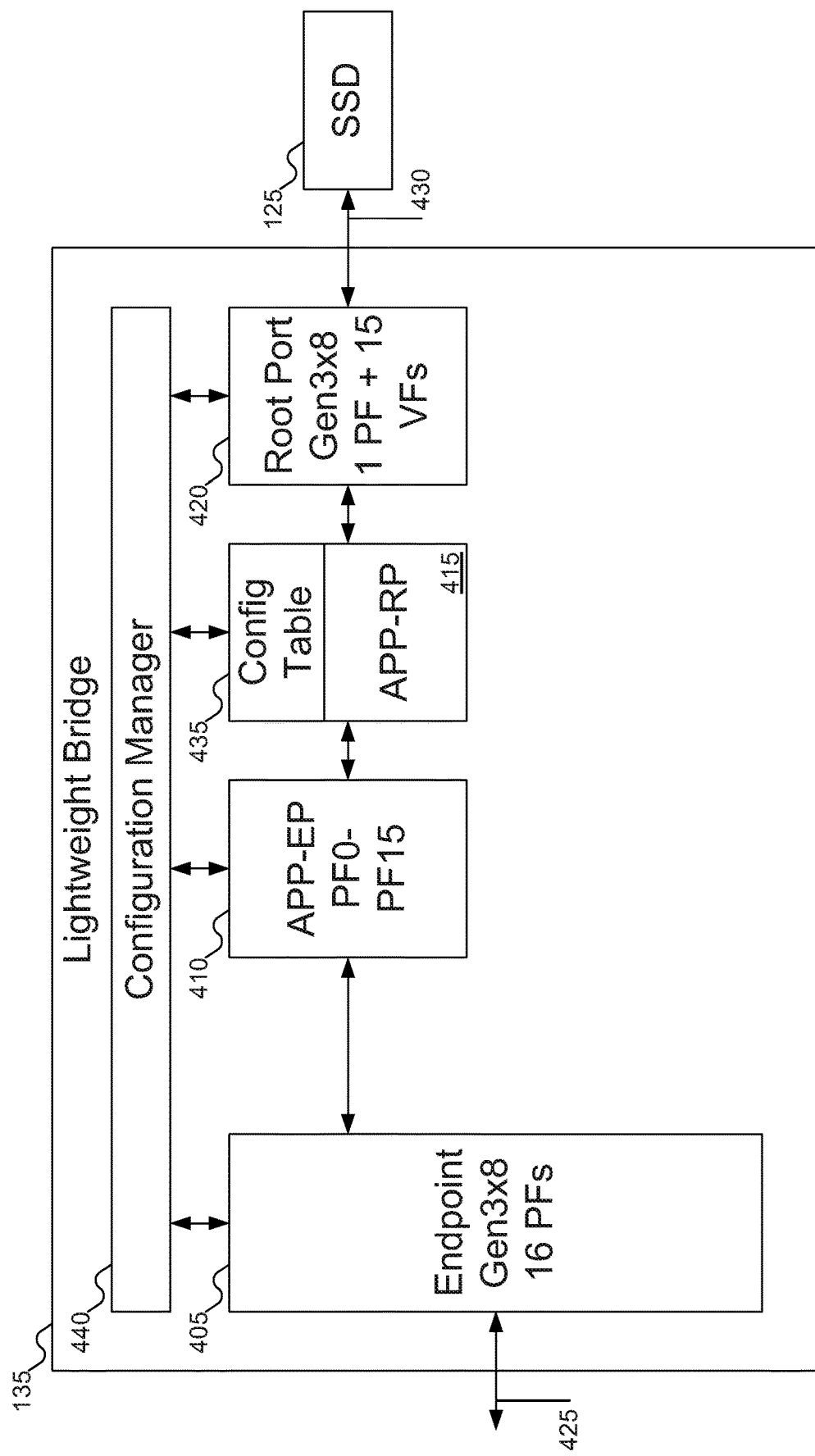
Figure 4C:
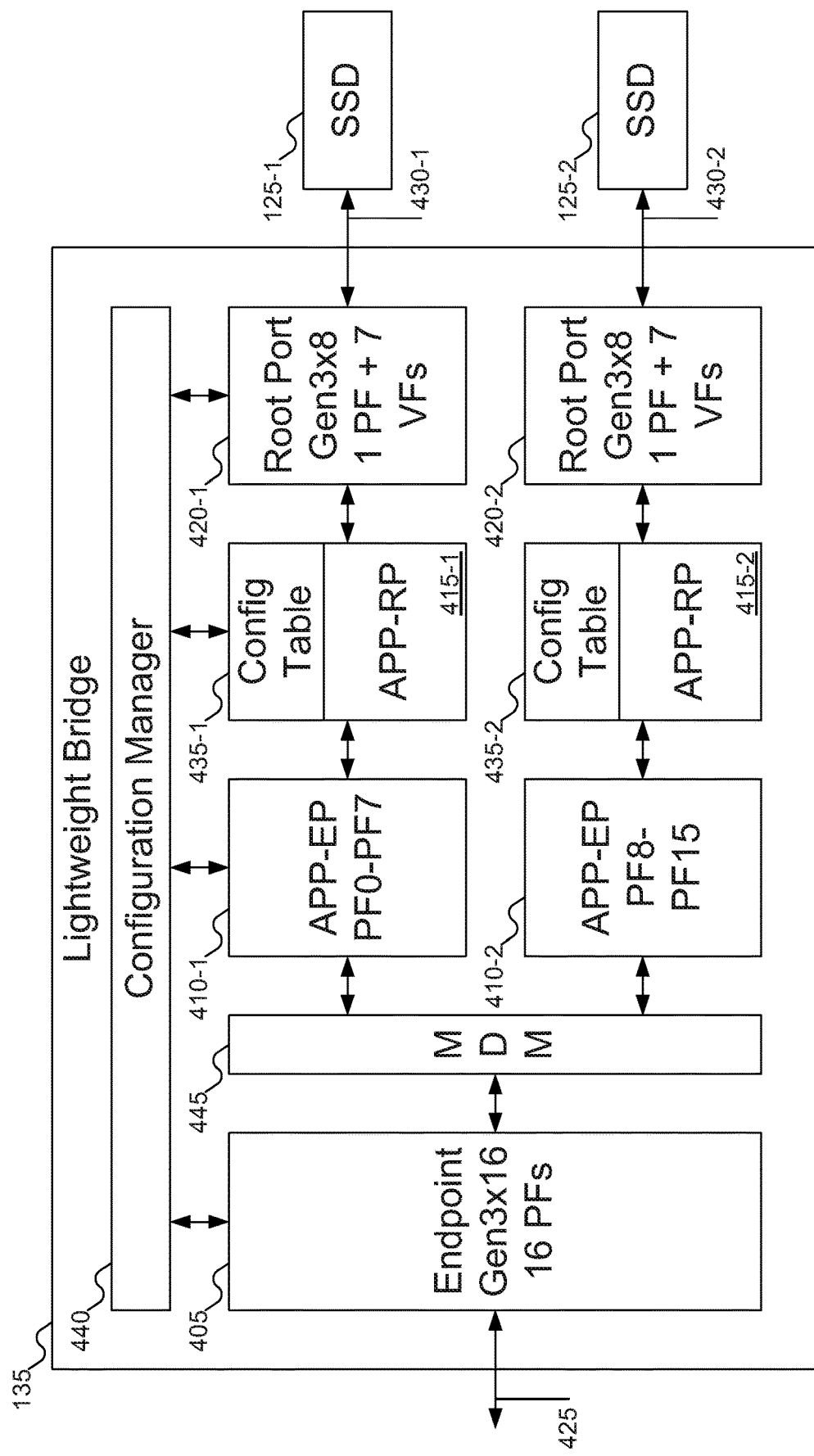

FIGS. 4A-4C show LWB 135 of FIG. 1 according to various embodiments of the inventive concept. In FIG. 4A, LWB 135 is shown as including endpoint 405, Application Layer-Endpoint (APP-EP) 410, Application Layer-Root Port (APP-RP) 415, and root port 420. Endpoint 405 may be used to communicate with root ports of other devices, such as host 105 of FIG. 1. In FIG. 4A, endpoint 405 is shown as exposing 16 PFs to the upstream devices, and as using a PCIe generation 3 interface with four lanes, which may be used to communicate with the upstream devices. Thus, the interface to host 105 of FIG. 1 may be a PCIe generation 3 interface with four lanes, as shown by interface 425. Similarly, root port 420 may communicate with endpoints of other devices, such as SSD 125. Thus, the interface to SSD 125 may be a PCIe generation 3 interface with four lanes, as shown by interface 430. In FIG. 4A, root port 420 is shown as using a PCIe generation 3 interface with four lanes, which may be used to communicate with the downstream devices. In FIG. 4A, root port 420 is shown as having enumerated one PF and 15 VFs from SSD 125, and endpoint 405 is shown as exposing 16 PFs: one PF exposed by endpoint 405 for each function (physical or virtual) exposed by SSD 125.

Endpoint 405 may communicate with APP-EP 410, which in turn may communicate with APP-RP 415. APP-EP 410 and APP-RP 415 may manage translation of information between endpoint 405 and root port 420. FIG. 4A does not show the specifics of how endpoint 405 communicates with APP-EP 410, how APP-EP 410 communicates with APP-RP 415, or how APP-RP 415 communicates with root port 420, because any desired communication mechanism may be used. For example, endpoint 405, APP-EP 410, APP-RP 415, and root port 420 may communicate using a PCIe or another bus, such as the Advanced eXtensible Interface (AXI) bus, with interfaces of any desired version and including any desired number of databus widths. Or, endpoint 405, APP-EP 410, APP-RP 415, and root port 420 may communicate using a proprietary messaging scheme using any desired buses/interfaces. Embodiments of the inventive concept may also include other mechanisms of communication between endpoint 405, APP-EP 410, APP-RP 415, and root port 420. There may be no relation between the manner of communication internal to LWB 135 and the manner of communication from LWB 135 to either host 105 of FIG. 1 or SSD 125.

APP-RP 415 may include configuration table 435. Configuration table 435 may store configuration information about LWB 135. Examples of such configuration information may include the mapping between the PFs exposed by endpoint 405 and the PFs/VFs offered by SSD 125 (and determined via enumeration through root port 420). Configuration information stored in configuration table 435 may also include information about Quality of Service (QoS) policies (which may also be termed Service Level Agreements (SLAs)) that may be associated with particular PFs exposed by endpoint 405. Configuration manager 440 may be used to configure LWB 135, storing information in configuration table 435. Configuration manager 440 may also be used to determine information about functions exposed by SSD 125, and may program endpoint 405 to offer similar (or identical) functionalities (but using just PFs, rather than PFs and VFs). The specifics of what configuration manager 440 does may depend on the specific functions offered by SSD 125 (since configuration manager 440 may configure endpoint 405 to provide a set of PFs that match the PFs and VFs offered by SSD 125), but the principles may generally be summarized as determining the configuration of the individual PFs/VFs exposed by SSD 125, establishing an appropriate number of PFs to be exposed by endpoint 405, and configuring those PFs to match the configuration of the PFs/VFs exposed by SSD 125.

While FIG. 4A shows APP-EP 410 and APP-RP 415 as separate components, embodiments of the inventive concept may combine these two components into a single component (responsible for handling the functions of both APP-EP 410 and APP-RP 415 as described). In fact, the entirety of LWB 135 may be implemented as a single unit, rather than as separate components that communicate with each other. LWB 135 (as well as endpoint 405, APP-EP 410, APP-RP 415, root port 420, and configuration manager 440) may be implemented using in any desired manner. Embodiments of the inventive concept may implement LWB 135 (and/or its components, individually and/or collectively) using a general purpose processor with appropriate software, a Field Programmable Gate Array (FPGA), an Application-Specific Integrated Circuit (ASIC), a Graphics Processing Unit (GPU), and a General Purpose GPU (GPGPU), among other possibilities.

In FIG. 4A (and similarly with FIGS. 4B-4C below), any specific numbers shown are intended to be examples only, and embodiments of the inventive concept may include other numbers. For example, root port 420 is shown as having enumerated 1 PF and 15 VFs from SSD 125, but SSD 125 may expose any number (zero or more) of PFs and VFs (although as any exposed VFs depend on hardware from some PF, there must be at least one PF exposed provide hardware for any exposed VFs). Similarly, endpoint 405 is shown as exposing 16 PFs, but endpoint 405 may expose any number (zero or more) PFs to host 105 of FIG. 1. Note too that while endpoint 405 exposes the same number of total functions as SSD 125, there does not need to be a one-to-one correspondence between functions exposed by SSD 125 and functions exposed by endpoint 405. For example, some functions exposed by SSD 125 might have no corresponding PF exposed by endpoint 405, or a single PF exposed by endpoint 405 might map to multiple functions (physical and/or virtual) exposed by SSD 125. As an example of the former, write requests might be directed to only one SSD at a time, which would leave the function that supports write requests on non-selected SSDs with no corresponding PF exposed by endpoint 405. As an example of the latter, in an embodiment of the inventive concept where LWB 135 is connected to multiple SSDs (such as shown in FIG. 4C below), a request by host 105 of FIG. 1 to perform garbage collection might be sent to all SSDs connected to LWB 135, even though only a single PF might be exposed by endpoint 405 to host 105 of FIG. 1 to request garbage collection be performed.

In a similar manner, any versions of specific products shown in FIG. 4A are intended to be examples only, and embodiments of the inventive concept may use other products or other versions of the product. For example, FIG. 4A shows LWB 135 communicating with host 105 of FIG. 1 (via interface 425) and with SSD 125 (via interface 430) using PCIe generation 3 with four lanes. Other embodiments of the inventive concept may use other generations of the PCIe bus/interface, or other numbers of lanes, or even another type of bus, such as the Advanced eXtensible Interface (AXI) bus. For example, FIG. 4B is similar to FIG. 4A except for the fact that interfaces 425 and 430 use PCIe generation 3 with eight lanes instead of four.

In some embodiments of the inventive concept, a single SSD 125 might not provide sufficient capabilities for the purposes of host 105 of FIG. 1. For example, what if SSD 125 of FIGS. 4A-4B only offered 1 PF and 7 VFs, and therefore did not offer a particular functionality desired by host 105 of FIG. 1? It would be possible to replace SSD 125 with another device that offered the desired functionality. But as an alternative, LWB 135 may connect to multiple devices, as shown in FIG. 4C.

In FIG. 4C, LWB 135 is shown connecting to SSDs 125-1 and 125-2, across interfaces 430-1 and 430-2, respectively. Because SSDs 125-1 and 125-2 each offer 1 PF and 7 VFs, (as may be seen in root ports 420-1 and 420-2), neither of SSDs 125-1 and 125-2 individually may offer 16 functions. But together, SSDs 125-1 and 125-2 offer 16 functions. Thus, by aggregating the resources (such as the exposed functions) of SSDs 125-1 and 125-2, LWB 135 may offer a total of 16 PFs without a single SSD offering all the functions.

As may be seen in FIG. 4C, LWB 135 includes only one endpoint 405, but two each of APP-EP 410-1 and 410-2, APP-RP 415-1 and 415-2, and root ports 420-1 and 420-2. In this manner, LWB 135 may expose all 16 functions from a single endpoint (endpoint 405), aggregating the functions offered by SSDs 125-1 and 125-2. But because different PFs exposed by endpoint 405 may be mapped to functions on SSDs 125-1 and 125-2, LWB 135 may also include multiplexer/demultiplexer 445. Multiplexer/demultiplexer 445 may route requests associated with particular exposed PFs of endpoint 405 to the appropriate APP-EP 410-1 or 410-2 whose communication path leads to SSD 125-1 or 125-2 that offers the corresponding PF or VF. While FIGS. 4A-4B do not show multiplexer/demultiplexer 445 (since there is only SSD 125 connected to LWB 135), LWB 135 may still include multiplexer/demultiplexer 445 in embodiments of the inventive concept where LWB 135 only connects to one SSD 125: multiplexer/demultiplexer 445 may not add any functionality, but neither is there any real cost associated with including multiplexer/demultiplexer 445. (But if LWB 135 is only capable of connecting to a single device, then including multiplexer/demultiplexer does not add any benefit either.)

Note that embodiments of the inventive concept may aggregate resources other than just exposed functions. For example, in FIG. 4C, interfaces 430-1 and 430-2 may each include eight lanes of the PCIe generation 3 bus/interface. But because SSDs 125-1 and 125-2 may be used in parallel (that is, both SSDs 125-1 and 125-2 may process requests at the same time), LWB 135 may offer 16 lanes of the PCIe generation 3 bus/interface via interface 425 to host 105 of FIG. 1. In the same manner, the bandwidth offered by each of SSD 125-1 and 125-2 may be aggregated, so that LWB may advertise a bandwidth equal to the sum of the bandwidths offered by SSDs 125-1 and 125-2 separately. Embodiments of the inventive concept may also aggregate other resources than functions, PCIe lanes, or bandwidth.

As with FIGS. 4A-4B, any numbers or versions shown in FIG. 4C are merely used as examples, and embodiments of the inventive concept may support other numbers or versions. For example, SSDs 125-1 and 125-2 do not need to offer the same number of exposed functions (physical and/or virtual), nor do they necessarily need to use the same generation or number of lanes of the PCIe bus/interface.

In FIGS. 4A-4C, LWB 135 is shown as separate from SSD 125. But embodiments of the inventive concept may combine these two devices into a single unit. That is, SSD 125 may include within its case LWB 135, situated before host interface logic 305 of FIG. 3 (or at least before SSD controller 310 of FIG. 3). Nor are embodiments of the inventive concept limited to including LWB 135 within a single SSD: a single housing that contains multiple SSDs may also contain LWB 135, to achieve the implementation shown in FIG. 4C. For purposes of this document, the term "connected" and similar terms is intended to mean any devices with which LWB 135 communicates, whether by virtue of physically sharing any hardware with the device or by virtue of a connection through some sort of interface due to LWB 135 being physically distinct from SSD 125.

As discussed above, one of the problems with devices exposing VFs is that host 105 of FIG. 1 may need to implement SR-IOV software to access the exposed VFs. This SR-IOV software adds a latency to communications with the device. But since the SR-IOV sequences used to manage access to the VFs of the device are known in advance, the SR-IOV sequences may be implemented using a state machine, relieving host 105 of FIG. 1 of the burden of having to use SR-IOV to access the VFs of the device. In addition, because the state machine may be implemented using hardware, using a state machine within LWB 135 instead of SR-IOV software within host 105 of FIG. 1 may also reduce the latency in processing the request. Using a state machine to implement SR-IOV sequences within LWB 135 essentially offloads and hides all the burdens of SR-IOV protocol to the device from the host. In other words, host 105 of FIG. 1 may be agnostic to the existence of any implementation of SR-IOV inside the device with which host 105 of FIG. 1 is communicating.

Figure 5:
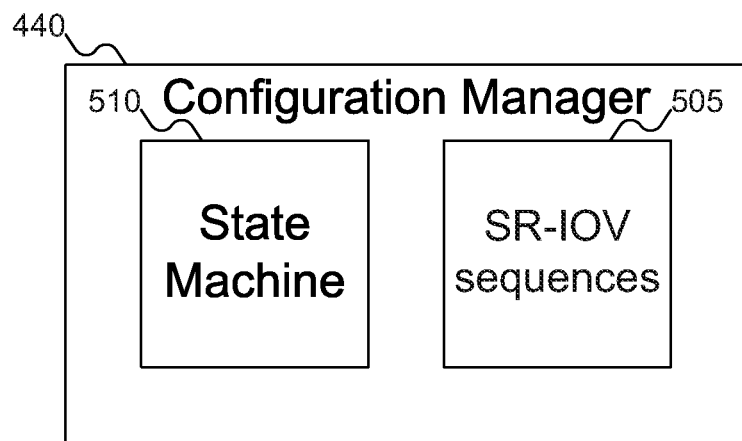
FIG. 5 shows details of the configuration manager of FIGS. 4A-4C.

FIG. 5 shows details of configuration manager 440 of FIGS. 4A-4C. In FIG. 5, configuration manager 440 may include Single Root Input/Output Virtualization (SR-IOV) sequences 505 and state machine 510. SR-IOV sequences 505 may be the sequences that would be implemented in the SR-IOV software within host 105 of FIG. 1 and may be carried out using state machine 510. SR-IOV sequences 505 may be stored in a Read-Only Memory (ROM) within configuration manager 440. State machine 510, like LWB 135 itself and its components shown in FIGS. 4A-4C, may be implemented using a general purpose processor, an FPGA, an ASIC, a GPU, or a GPGPU, among other possibilities.

Figure 6:
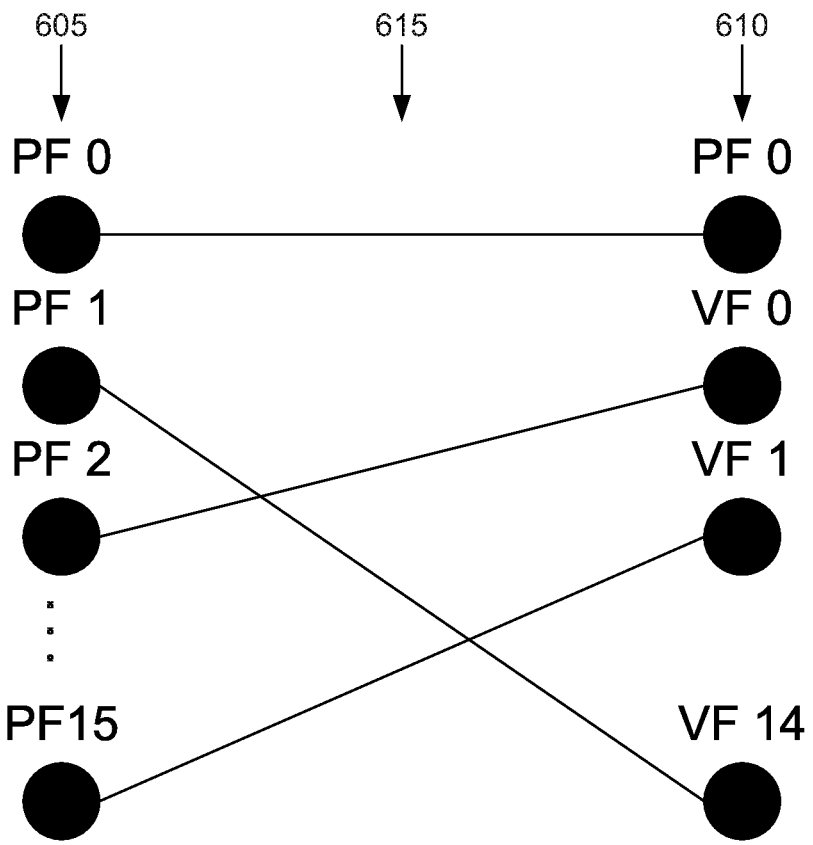
FIG. 6 shows a mapping between PFs exposed by the LWB of FIG. 1 and PFs/VFs exposed by the SSD of FIG. 1.

FIG. 6 shows a mapping between PFs exposed by LWB 135 of FIG. 1 and PFs/VFs exposed by SSD 125 of FIG. 1 (or SSDs 125-1 and 125-2 of FIG. 4C). In FIG. 6, PFs 605 are the PFs exposed by LWB 135 of FIG. 1 (more specifically, the PFs exposed by endpoint 405 of FIGS. 4A-4C). PFs/VFs 610, on the other hand, are the functions (both physical and virtual) exposed by SSD 125 of FIG. 1. Mapping 615 may then represent the mapping between PFs 605 and PFs/VFs 610. The mapping shown in FIG. 6 is for illustrative purposes and is essentially arbitrary, although configuration manager 440 of FIGS. 4A-4C may use any desired mechanism to decide which PF of PFs 605 maps to which PF/VF of PFs/VFs 610. The mapping may be implemented considering guidance and/or policies set by either host 105 of FIG. 1 (or a Baseboard Management Controller (BMC) within host 105 of FIG. 1), or SSD 125 of FIG. 1.

Figure 7:
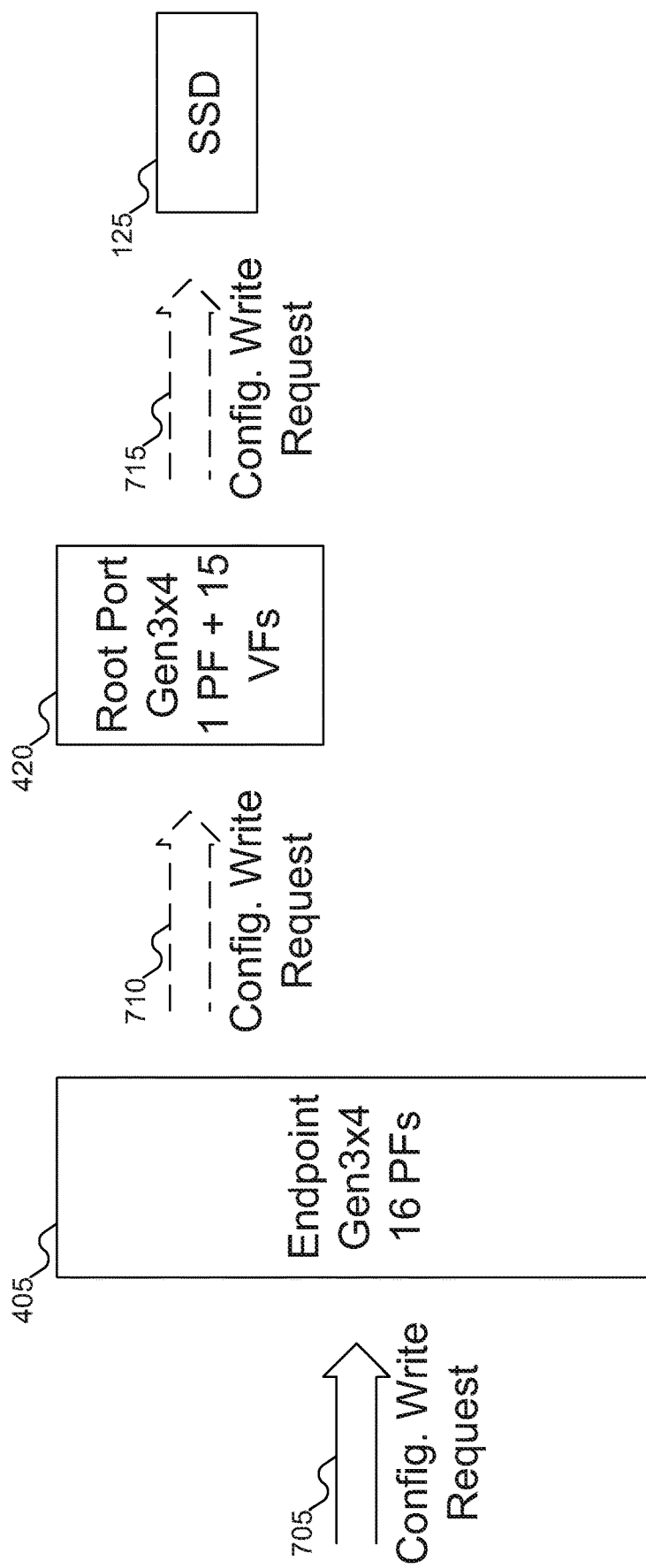
FIG. 7 shows the LWB of FIG. 1 processing a configuration write request from the host of FIG. 1.

FIG. 7 shows LWB 135 of FIG. 1 processing a configuration write request from host 105 of FIG. 1. In FIG. 7, LWB 135 of FIG. 1 (more specifically, endpoint 405) may receive configuration write request 705. Endpoint 405 may then process configuration write request 705 locally to make whatever changes are included in configuration write request 705.

Note that configuration write request 705 might not require changes to be made to SSD 125. For example, a QoS policy established by host 105 of FIG. 1 might only impact a PF exposed by endpoint 405, and not require any changes within SSD 125. But in some situations configuration write request 705 may also require modification of SSD 125. For example, configuration write request might change data about the underlying function on SSD 125, rather than data that may be managed solely by LWB 135 of FIG. 1. In such situations endpoint 705 may propagate configuration write request 705 to SSD 125 via root port 420 (as shown by dashed arrows 710 and 715). Configuration write request 705 may be forwarded to root port 420 either via APP-EP 410 of FIGS. 4A-4C and APP-RP 415 of FIGS. 4A-4C, or through configuration manager 440 of FIGS. 4A-4C. Configuration table 435 of FIGS. 4A-4B may be used to determine whether configuration write request 705 should be applied to SSD 125 as well (to ensure that the configurations of endpoint 405 and SSD 125 mirror each other).

As with FIGS. 4A-4C, the specifics of how endpoint 405 (and possibly SSD 125) may be configured depend heavily on the specifics of configuration write request 705. But once the specifics of configuration write request 705 are known, the changes to make to endpoint 405 (and possibly to SSD 125) may be straightforward to carry out.

As mentioned above, it is desirable for the configurations of endpoint 405 and SSD 125 to mirror each other. But as noted above, there may be some configurations that apply solely to endpoint 405 (or that would not matter to SSD 125 because endpoint 405 may process those changes). Where the configuration changes would not matter to SSD 125, those configuration changes need not be delivered to SSD 125.

In FIG. 7, configuration write request 705 is described as originating from host 105 of FIG. 1. But embodiments of the inventive concept may support SSD 125 requesting configuration changes in endpoint 405 of FIGS. 4A-4C. That is to say, SSD 125 of FIG. 1 may dynamically, during run time, request changes to the configuration, features, or capabilities of the PFs exposed by endpoint 405 of FIGS. 4A-4C to host 105 of FIG. 1. For example, SSD 125 of FIG. 1 may increase or reduce a number of interrupt vectors for a PF exposed by endpoint 405 of FIGS. 4A-4C. Such a change may be result from the changes in the application requirements communicated by host 105 of FIG. 1 to SSD 125 of FIG. 1 (via LWB 125 of FIG. 1) using higher level storage communication protocol such as Non-Volatile Memory Express (NVMe).

Figure 8:
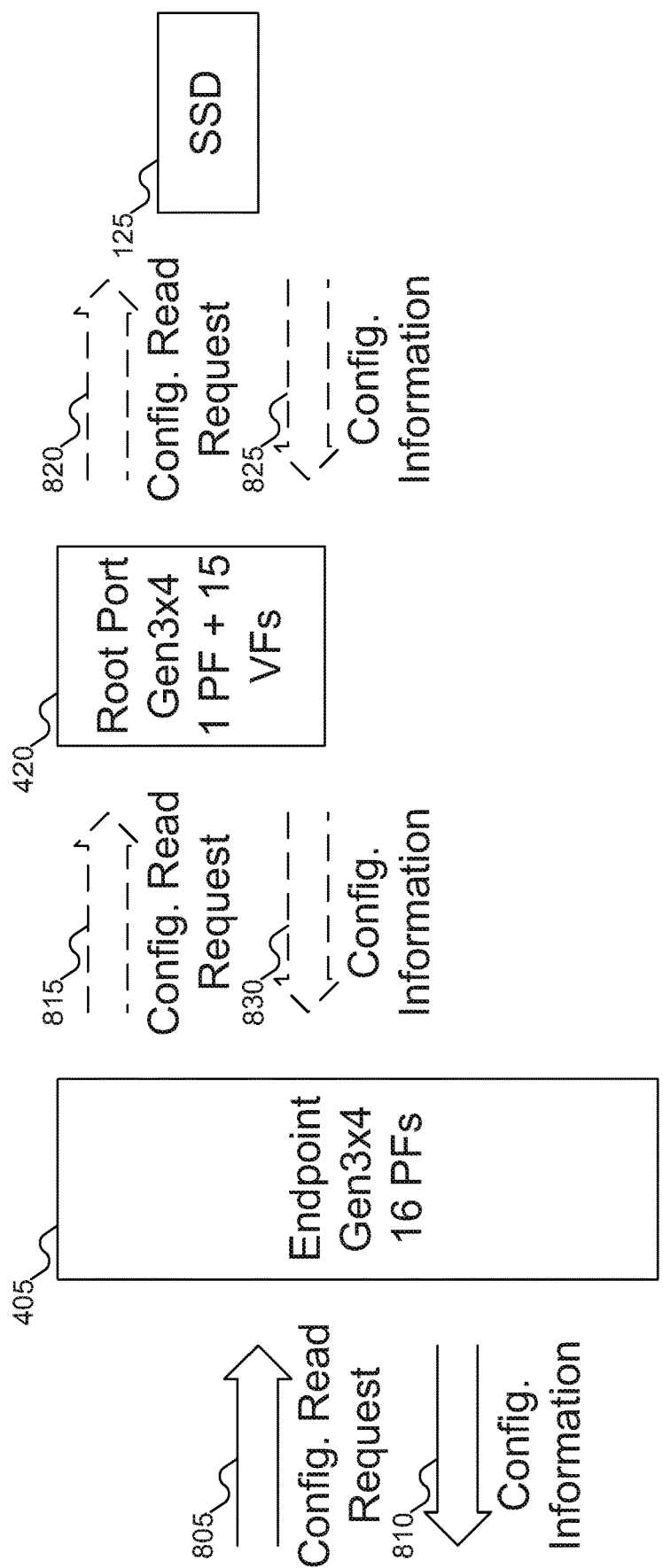
FIG. 8 shows the LWB of FIG. 1 processing a configuration read request from the host of FIG. 1.

FIG. 8 shows LWB 135 of FIG. 1 processing a configuration read request from host 105 of FIG. 1. In FIG. 8, endpoint 405 may receive configuration read request 805 from host 105 of FIG. 1. Endpoint 405 may then read the requested configuration information and return it to host 105 of FIG. 1 as configuration information 810.

As with configuration write request 705 of FIG. 7, configuration read request 805 may be delivered to SSD 125 to be read from SSD 125. Thus, configuration read request 805 may be delivered as configuration read requests 815 and 820 to root port 420 and SSD 125, respectively, with configuration information 810 returned as configuration information 825 and 830. But since the configuration of endpoint 405 should mirror the configuration of SSD 125, it may not be needed to deliver configuration read request 805 to SSD 125 to determine the requested configuration information. In addition, as with configuration write request 705 of FIG. 7, configuration read request 805 may be delivered to root port 420 either via APP-EP 410 of FIGS. 4A-4C and APP-RP 415 of FIGS. 4A-4C, or through configuration manager 440 of FIGS. 4A-4C.

Figure 9:
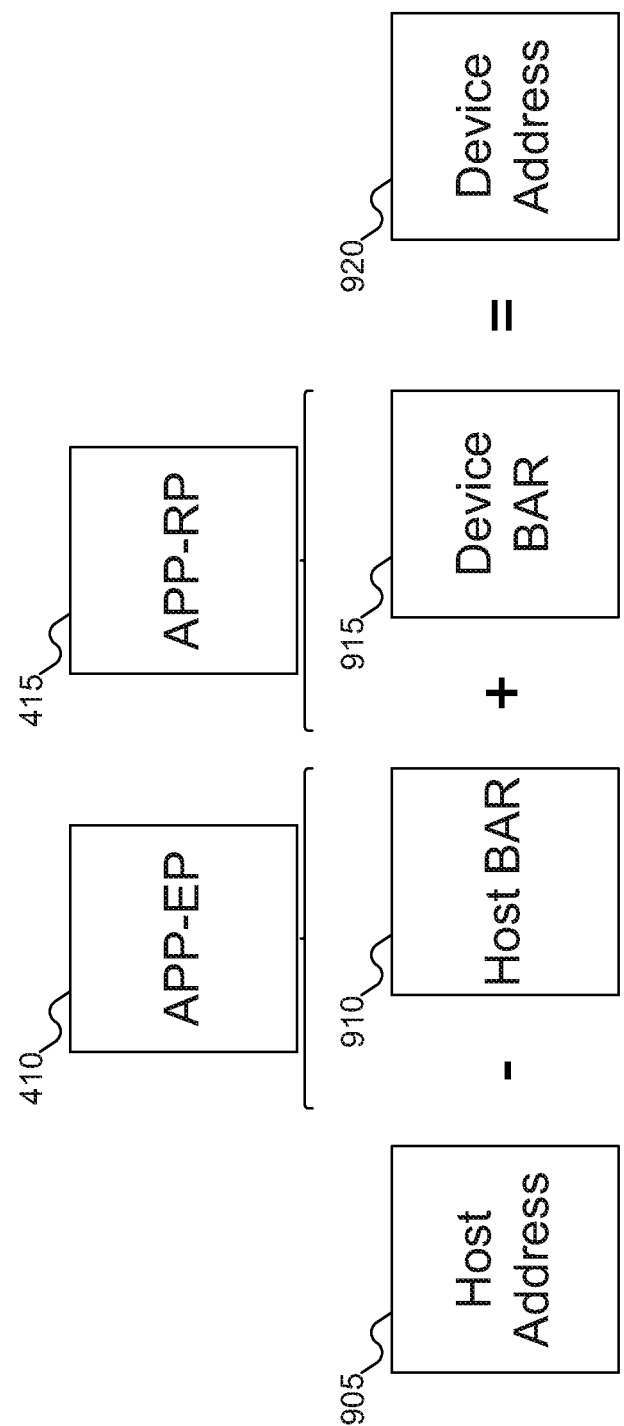
FIG. 9 shows the Application Layer-Endpoint (APP-EP) and the Application Layer-Root Port (APP-RP) of FIGS. 4A-4C handling address translation within the LWB.

FIG. 9 shows Application Layer-Endpoint (APP-EP) 410 of FIGS. 4A-4C and Application Layer-Root Port (APP-RP) 415 of FIGS. 4A-4C handling address translation within LWB 135. In FIG. 9, address 905 may be an address received from host 105 of FIG. 1 (for example, an NVMe register that host 105 of FIG. 1 requests to be read). APP-EP 410 may then subtract host Base Address Register (BAR) 910 for the PF being invoked by host 105 of FIG. 1. APP-RP 415 may then add SSD BAR 915 for the PF/VF to which the requested PF of endpoint 405 of FIGS. 4A-4C maps, thereby producing SSD address 920. In this manner, APP-EP 410 and APP-RP 415 may translate an address as seen from the host's perspective to an address that may be processed by SSD 125 of FIG. 1.

Note that the process may be used in reverse to translate an SSD address back to an address from the host's perspective. Thus, APP-RP 415 may subtract SSD BAR 915 from SSD address 920 and APP-EP 410 may add host BAR 910, thereby producing host address 905.

Figure 10:
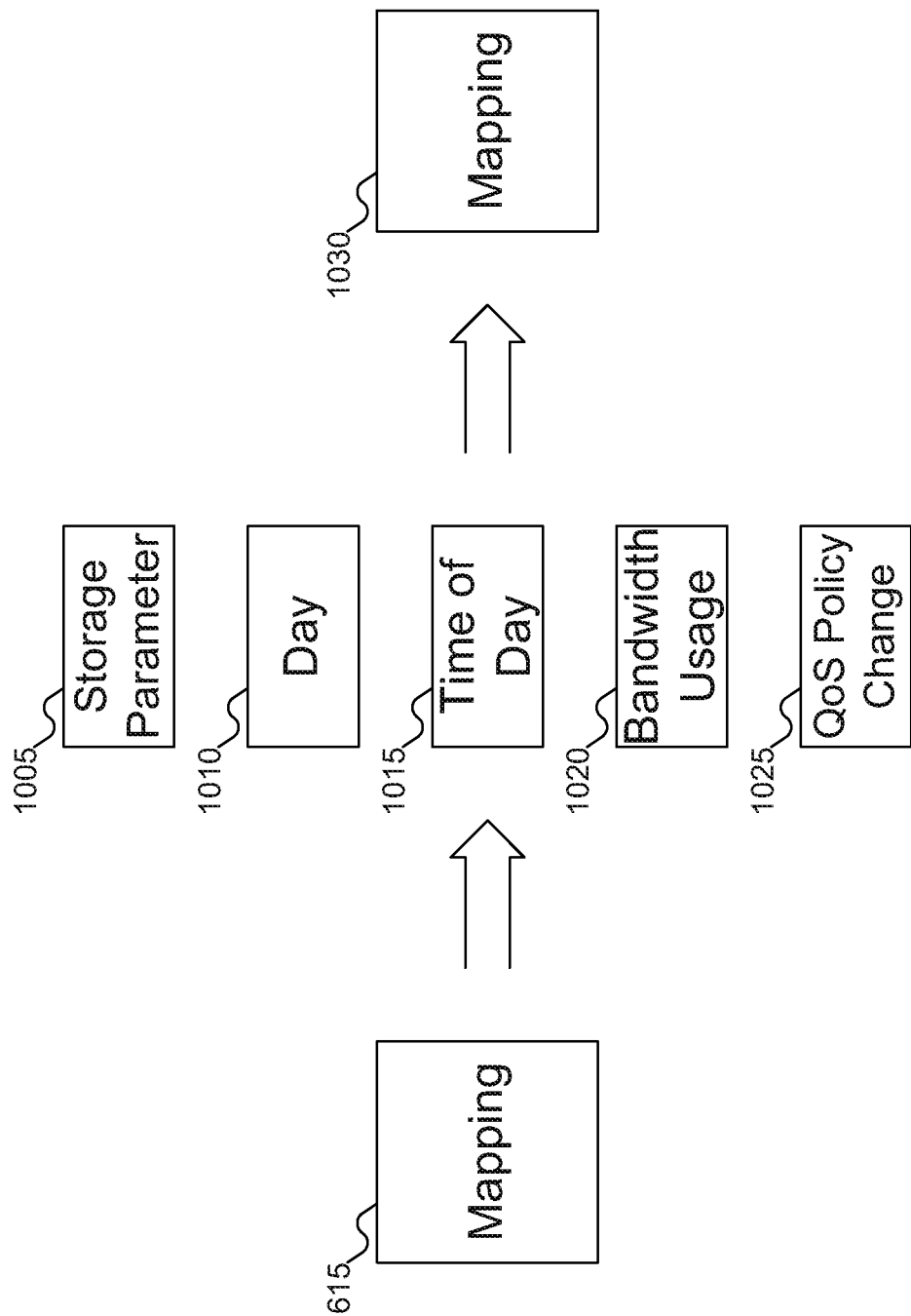
FIG. 10 shows the mapping of FIG. 6 being changed within the LWB of FIG. 1.

FIG. 10 shows the mapping of FIG. 6 being changed within LWB 135 of FIG. 1. There are a number of reasons why mapping 615 might change. For example, storage parameter 1005 might trigger a change to mapping 615: for example, if the available capacity on a particular SSD drops below a threshold amount of free space new write requests might be directed to a different SSD, such as SSD 125-2 of FIG. 4C, connected to LWB 135 of FIG. 1. Alternatively, day 1010 or time of day 1015 might trigger a change to mapping 615: for example, peak times for particular requests at a particular host 105 might be between 6:30 am and 8:00 am, and between 5:00 pm and 9:00 pm, so bandwidth associated with the PFs that handles such requests might be increased during those hours and decreased at other hours. Day 1010 and time of day 1015 may be generalized to any trigger that is related to day and/or time, even if not specified using conventional or known day/time values. For example, at the conclusion of a sporting event, it may be expected that fans travelling home may request directions from a GPS application on their smartphones, even though the specific time at which such requests will begin may not be known (sporting event durations are approximately known, but may run shorter or longer depending on the event itself). Bandwidth usage 1020 itself may also trigger a change to mapping 615: for example, to balance loads across SSDs connected to LWB 135 of FIG. 1. Finally, change 1025 in QoS policy might trigger a change to mapping 615: for example, the addition of new QoS policy may require changes in how functions are mapped. Embodiments of the inventive concept may also include other triggers to changes in mapping 615. Regardless of the trigger, as a result of the change mapping 615 may be replaced with mapping 1030, which still maps PFs exposed by endpoint 405 of FIGS. 4A-4C to PFs/VFs exposed by SSD 125 of FIG. 1, but perhaps in a different arrangement.

Figure 11:
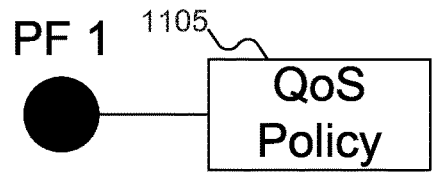
FIG. 11 shows a PF exposed by the LWB of FIG. 1 having an associated Quality of Service (QoS) policy.

FIG. 11 shows a PF exposed by LWB 135 of FIG. 1 having an associated Quality of Service (QoS) policy. In FIG. 11, one PF (as exposed by endpoint 405 of FIGS. 4A-4C) is shown, with a single QoS policy 1105 associated with the exposed PF. But embodiments of the inventive concept may include exposed PFs with any number of associated QoS policies. For example, some PFs exposed by endpoint 405 of FIGS. 4A-4C may have no associated QoS policies; other PFs exposed by endpoint 405 of FIGS. 4A-4C may have two or more associated QoS policies.

Given QoS policy 1105 associated with a PF exposed by endpoint 405 of FIGS. 4A-4C, LWB 135 of FIG. 1 may enforce that QoS policy according to its specifications. Again, since the specifications may vary widely, the specifics of how LWB 135 of FIG. 1 enforces a particular QoS policy may not be stated herein. But as an example, QoS policy 1105 might specify a maximum (and/or minimum) bandwidth for a particular PF (thus ensuring that the particular PF either does not prevent other PFs from receiving their fair share of bandwidth or ensuring that the particular PF receives its specified allotment of bandwidth). Then, LWB 135 of FIG. 1 may ensure that QoS policy 1105 is satisfied, by preventing communications using that corresponding PF/VF on SSD 125 of FIG. 1 from exceeding the maximum bandwidth, or by ensuring that communications using PFs/VFs on SSD 125 of FIG. 1 other than the PF/VF corresponding to the PF guarantee the minimum bandwidth for the exposed PF.

While LWB 135 of FIG. 1 may enforce QoS policy 1105, it is up to host 105 of FIG. 1 (or SSD 125 of FIG. 1, if SSD 125 of FIG. 1 requests that the policy be applied) to make sure that the policy is proper. For example, assume that SSD 125 of FIG. 1 has a maximum bandwidth of 100 Gb/second, with a total of 16 functions (PF and VF) supported. If the host were to assign QoS policies that guaranteed each PF exposed by LWB 135 a minimum bandwidth of 10 GB/second, the total allocated bandwidth would be 160 GB/second, which exceeds the capabilities of SSD 125 of FIG. 1. As a result, some PFs would not have their associated QoS policies satisfied. Thus, while LWB 135 of FIG. 1 may enforce QoS policy 1105, LWB 1105 might not check that QoS policy 1105, in combination with other QoS policies assigned to various PFs, may all be enforced simultaneously.

Thus, there is a difference between enforcing a QoS policy and ensuring that a QoS policy is always enforceable. LWB 135 of FIG. 1 may do the former; it might not do the latter. But it is worth nothing that just because a set of QoS policies may not be simultaneously enforced, that fact does not mean that there will come a time when any individual QoS policy will not be satisfied. For example, consider again SSD 125 of FIG. 1 offering a total of 10 GB/second of bandwidth, and assume host 105 of FIG. 1 specifies QoS policies for two different PFs exposed by endpoint 405 of FIGS. 4A-4C, guaranteeing each PF a minimum bandwidth of 6 GB/second. Collectively, both QoS policies may not be satisfied, since each PF is "assured" 6 GB/second of the available 10 GB/second of bandwidth of SSD 125 of FIG. 1. But if it turns out that it is logically (or physically) impossible for both functions to be invoked at the same time (for example, if one function involves reading data from or writing data to SSD 125 of FIG. 1, and the other function involves SSD 125 of FIG. 1 performing an internal consistency check that causes SSD 125 of FIG. 1 to be unable to respond to any other functions until the consistency check is complete), then it may be possible for host 105 of FIG. 1 to specify both QoS policies: even though they cumulatively exceed the bandwidth offered by SSD 125 of FIG. 1, both policies would not be enforced at the same time, so there is only a logical conflict, not an actual (or even potential) conflict.

Figure 12A:
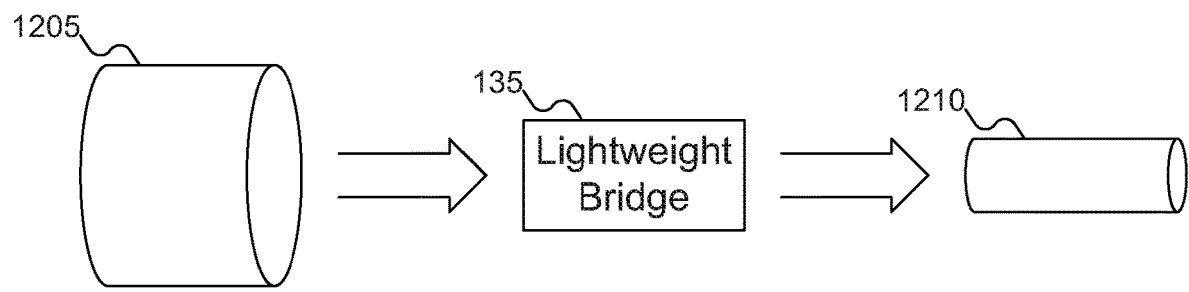
FIGS. 12A-12B show the LWB of FIG. 1 performing bandwidth throttling.
Figure 12B:
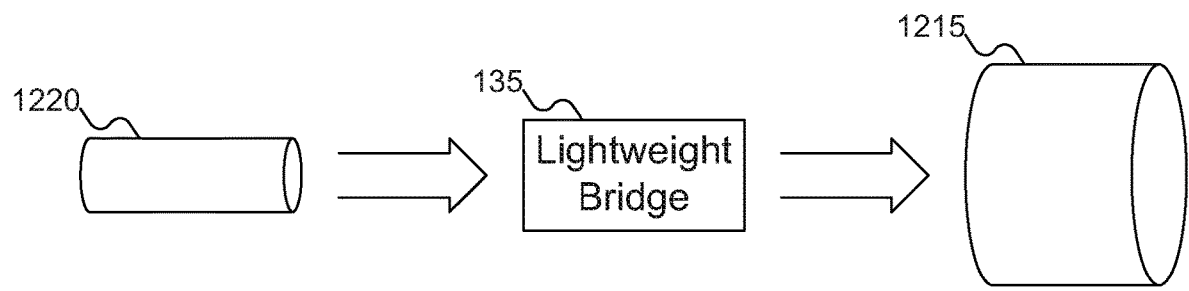

As mentioned above, sometimes LWB 135 of FIG. 1 may need to perform bandwidth throttling: for example, to prevent a particular PF exposed by endpoint 405 of FIGS. 4A-4C from using so much bandwidth that other functions of SSD 125 of FIG. 1 are overly limited. FIGS. 12A-12B show LWB 135 of FIG. 1 performing bandwidth throttling. In FIG. 12A, LWB 135 is shown as receiving "high" or "large" bandwidth 1205 from host 105 of FIG. 1. If this bandwidth is too large for whatever reason, LWB 135 may throttle the bandwidth to SSD 125 of FIG. 1, as shown by "low" or "small" bandwidth 1210. In FIG. 12B, the reverse situation is shown: LWB 135 may have "high" or "large" bandwidth 1215 with SSD 125 of FIG. 1, but may throttle bandwidth 1220 with host 105 of FIG. 1. Thus, when the available bandwidth of SSD 125 of FIG. 1 is higher than maximum bandwidth of an SLA set for a PF, LWB 135 may throttle bandwidth.

Embodiments of the inventive concept may perform bandwidth throttling for any number of reasons. Aside from QoS policy 1105 of FIG. 11 (which may throttle the bandwidth associated with a particular PF exposed by endpoint 405 of FIGS. 4A-4C if the bandwidth for that PF is too large), other reasons for throttling bandwidth may include temperature or power consumption. For example, if the temperature of LWB 135 (or SSD 125 of FIG. 1) becomes too high (that is, exceeds some threshold), LWB 135 may throttle the bandwidth to reduce the temperature. Then, once the temperature has dropped sufficiently (which might mean dropping below the original threshold or dropping below another threshold, which may be lower than the original threshold), LWB 135 may stop throttling the bandwidth. Power consumption may trigger bandwidth throttling in the same way as temperature, except that the power consumption of LWB 135 (or SSD 125 of FIG. 1) may trigger bandwidth throttling, with a reduced power consumption threshold releasing bandwidth throttling. These thresholds may be stored somewhere within LWB 135. Yet another reason why bandwidth might be throttled may be due to priorities established for the PFs exposed by endpoint 405 of FIGS. 4A-4C: when different PFs are in use, bandwidth on a PF with a lower priority may be throttled to favor bandwidth for the PF with a higher priority.

Another reason to throttle bandwidth may be to manage QoSs or SLAs. For example, host 105 of FIG. 1 might only pay for a lower level of bandwidth than what LWB 135 is capable of offering. Thus, even though it might be possible for host 105 of FIG. 1 and LWB 135 to communicate using a higher overall bandwidth, LWB 135 may limit the bandwidth to host 105 of FIG. 1 so that the provided service is no greater than what has been guaranteed to host 105 of FIG. 1. In other words, LWB 135 may limit or cap the maximum storage bandwidth to a PF based on SLA or pricing plans.

Note that while FIGS. 12A-12B discuss bandwidth specifically, other resources may be similarly monitored and throttled, either for communications with host 105 of FIG. 1 or SSD 125 of FIG. 1. For example, latency may controlled to some extent, favoring PFs with lower target latencies than PFs with higher target latencies.

LWB 135 may measure and monitor bandwidth (or other resources) consumed by each PF individually exposed by endpoint 405 of FIGS. 4A-4C. Bandwidth may be measured and monitored in both directions: i.e., host to device (host write operations) and device to host (host read operations). Bandwidth throttling may also be performed in either direction independently. Bandwidth (or other resource) throttling may be performed as a result of both the measured bandwidth and QoS policy settings.

Figure 13:
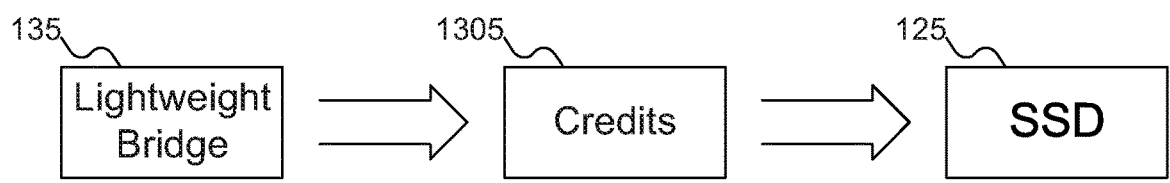
FIG. 13 shows the LWB of FIG. 1 issuing credits to the SSD of FIG. 1.

FIG. 13 shows LWB 135 of FIG. 1 issuing credits to SSD 125 of FIG. 1. Credits are one way in which LWB 135 may manage how much bandwidth is used by SSD 125. Given a particular request, LWB 135 may issue a certain number of credits 1305, with each credit 1305 representing a specific amount of data that SSD 125 may transfer. Thus, the number of credits 1305 LWB 135 issues may control the bandwidth of SSD 125: LWB 135 may issue just enough (or nearly just enough, or any other desired number) credits 1305 to cover the data transfer. When SSD 125 transfers data, that data transfer uses the credits 1305: if SSD 125 does not have any credits available, then SSD 125 may not transfer any data until new credits are issued. Credits 1305 may be issued in any desired manner. In some embodiments of the inventive concept, LWB 135 may send credits 1305 to SSD 125 via a message, which may be, for example, a proprietary message. In other embodiments of the inventive concept, LWB 135 may write credits 1305 into a particular address on SSD 125: for example, a reserved address in a NVMe address space. In yet other embodiments of the inventive concept, LWB 135 may write credits 1305 into an address (again, possibly a reserved address) within LWB 135: SSD 125 may then read that address to see what credits 1305 are available. The use of credits 1305 is one way to throttle the bandwidth of SSD 125. By limiting the number of credits 1305 issued to SSD 125, SSD 125 may be prevented from downloading all of the data needed for a particular transaction within a given unit of time. By reducing the bandwidth on SSD 125, SSD 125 may experience reduced power consumption and/or lower temperatures. Eventually, if power consumption and/or temperature drop to acceptable levels (which may differ from the levels at which bandwidth throttling may be started, as discussed above with reference to FIG. 12), LWB 135 may stop throttling the bandwidth of SSD 125.

In another embodiments, LWB 135 may insert idle periods between data transfer packets to achieve bandwidth throttling. By adjusting the inter-packet gap of the data packets, based on measured bandwidth (or other resources) and the QoS policy settings, LWB 135 may achieve desired bandwidth limits for an individual PF or or all the PFs collectively.

Figure 14A:
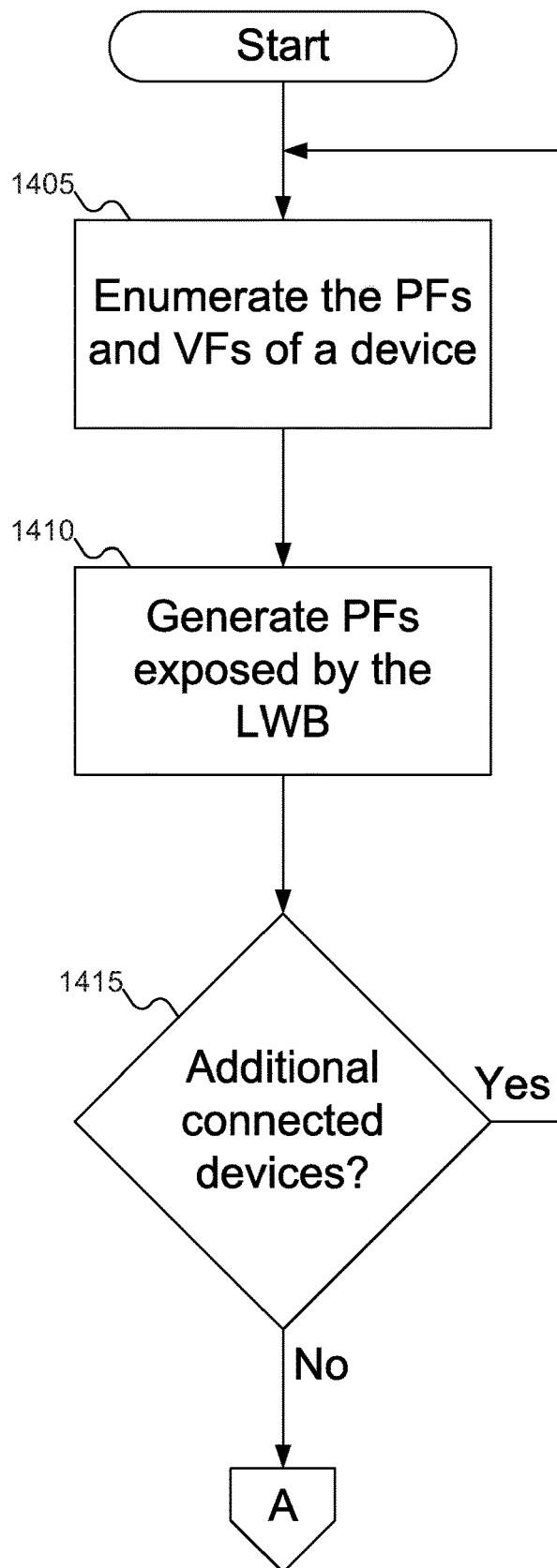
FIGS. 14A-14B show a flowchart of an example procedure for the LWB of FIG. 1 to identify the PFs/VFs exposed by the SSD of FIG. 1, expose PFs from the LWB, and generate a mapping between the PFs exposed by the LWB of FIG. 1 and the PFs/VFs exposed by the SSD of FIG. 1, according to embodiments of the inventive concept.
Figure 14B:
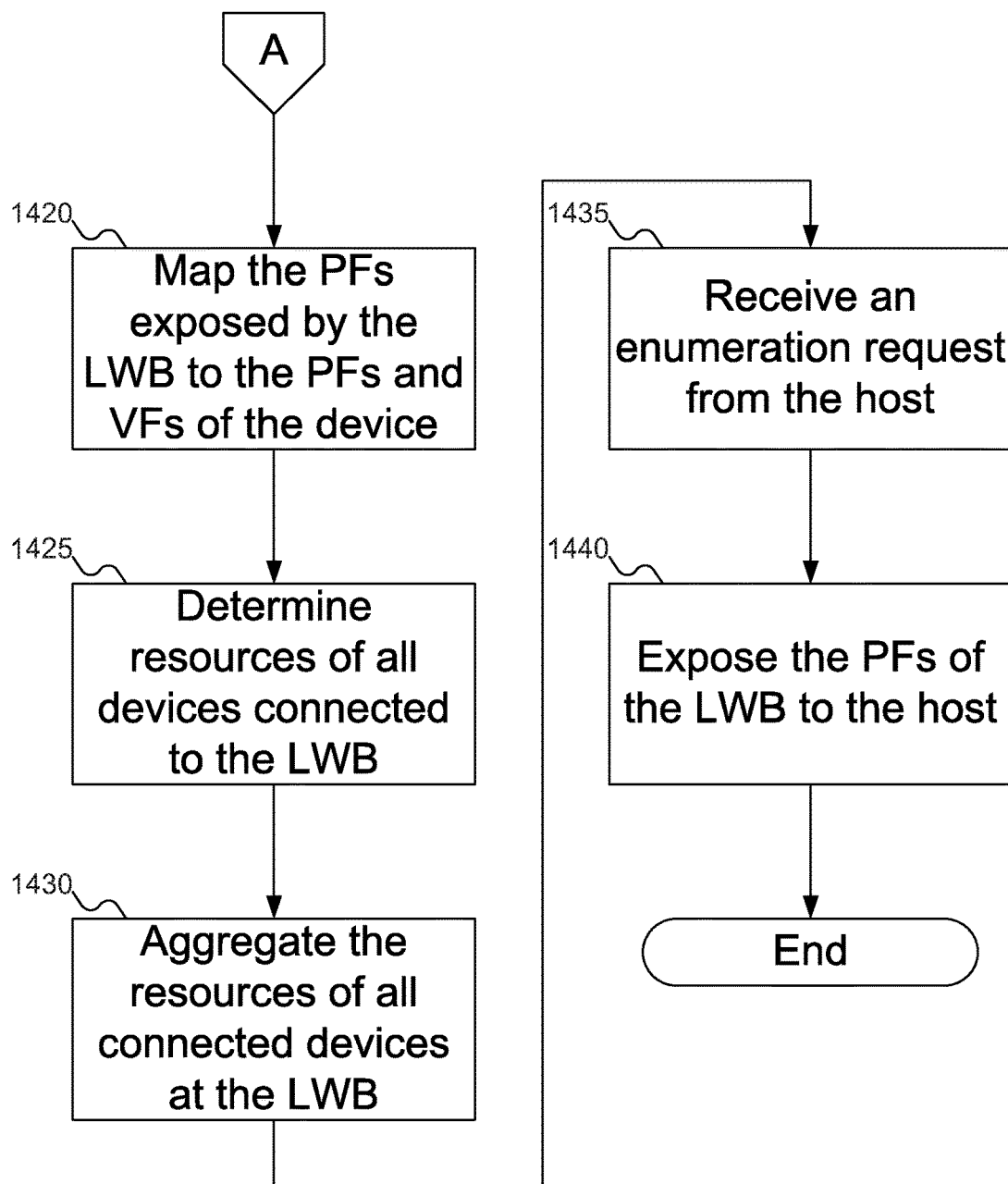

FIGS. 14A-14B show a flowchart of an example procedure for LWB 135 of FIG. 1 to identify the PFs/VFs exposed by SSD 125 of FIG. 1, expose PFs from LWB 135, and generate mapping 615 between the PFs exposed by LWB 135 of FIG. 1 and the PFs/VFs exposed by SSD 125 of FIG. 1, according to embodiments of the inventive concept. In FIG. 14A, at block 1405, LWB 135 of FIG. 1 may enumerate the PFs and VFs exposed by SSD 125 of FIG. 1. At block 1410, LWB 135 of FIG. 1 may generate PFs to be exposed by LWB 135 of FIG. 1 (more specifically, the PFs to be exposed by endpoint 405 of FIGS. 4A-4C). Note that the number of PFs generated by LWB 135 of FIG. 1 may not necessarily equal the number of PFs and VFs exposed by SSD 125 of FIG. 1: certain functions exposed by SSD 125 of FIG. 1 might not get corresponding PFs exposed by LWB 135 of FIG. 1, and a single PF exposed by LWB 135 of FIG. 1 might map to multiple PFs/VFs of SSD 125 of FIG. 1. At block 1415, LWB 135 of FIG. 1 may check to see if there are any other connected devices to enumerate (such as SSD 125-2 of FIG. 4C). If so, then processing may return to block 1405 to enumerate the PFs and VFs of the next device.

Assuming that all connected devices have been enumerated, then at block 1420 (FIG. 14A), LWB 135 of FIG. 1 may map the PFs exposed by endpoint 405 of FIGS. 4A-4C to the PFs and VFs exposed by SSD 125 of FIG. 1 (and other connected devices). At block 1425, LWB 135 of FIG. 1 may determine other resources, such as bandwidth, of SSD 125 of FIG. 1 and any other connected devices (this determination may also be made part of block 1405 of FIG. 14A), and at block 1430, LWB 135 of FIG. 1 may aggregate the resources of all connected devices. In this manner, LWB 135 of FIG. 1 may appear to offer higher overall resources than any of the individual devices.

At block 1435, LWB 135 of FIG. 1 may receive an enumeration request from host 105 of FIG. 1. At block 1440, LWB 135 of FIG. 1 may respond to the enumeration request of host 105 of FIG. 1 by exposing the PFs of endpoint 405 of FIGS. 4A-4C.

Figure 15A:
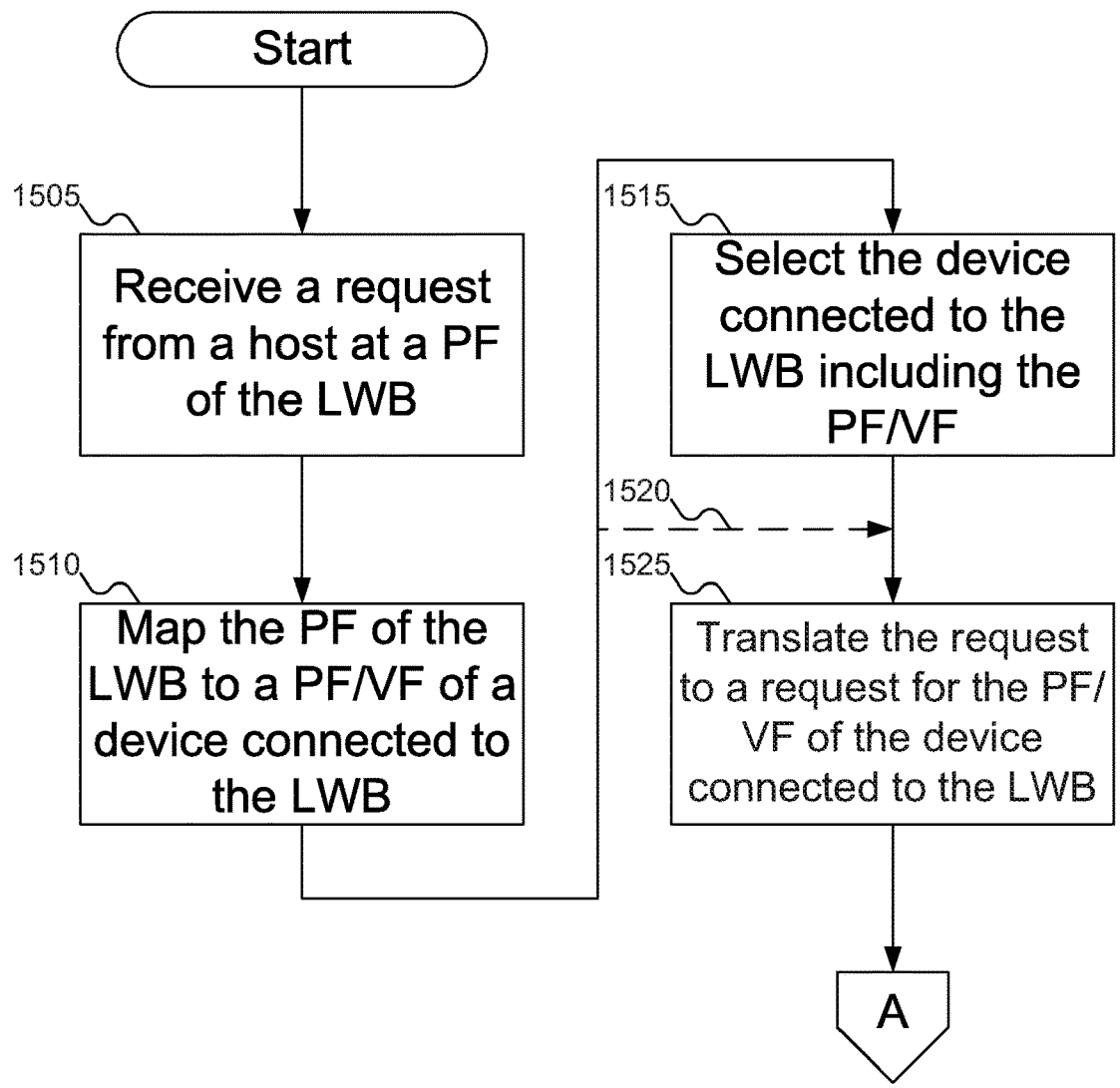
FIGS. 15A-15B show a flowchart of an example procedure for the LWB of FIG. 1 to receive a process a request from the host of FIG. 1.
Figure 15B:
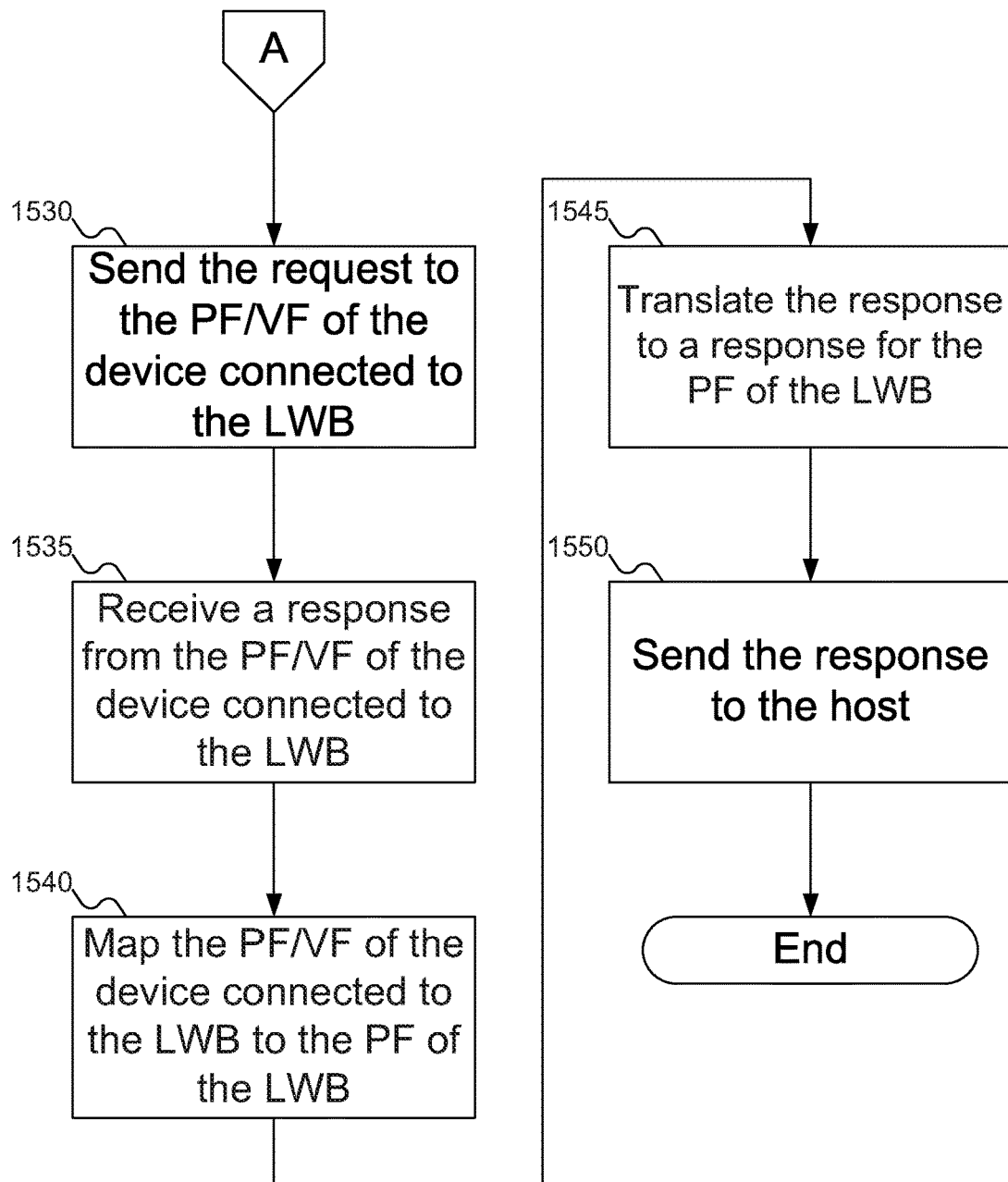

FIGS. 15A-15B show a flowchart of an example procedure for LWB 135 of FIG. 1 to receive and process a request from host 105 of FIG. 1. In FIG. 15A, at block 1505, LWB 135 of FIG. 1 may receive from host 135 of FIG. 1 a request at some PF exposed by endpoint 405 of FIGS. 4A-4C: which PF the request is directed toward, and what function that PF represents, is not relevant to the analysis. At block 1510, LWB 135 of FIG. 1 may map the PF to which the request was directed to a PF or VF of SSD 125 of FIG. 1 (which mapping may be performed using, for example, configuration table 435 of FIGS. 4A-4C). At block 1515, LWB 135 may select SSD 125 of FIG. 1 as the device which includes the PF or VF to which the PF exposed by endpoint 405 of FIGS. 4A-4C maps. Note that block 1515 may only matter if LWB 135 of FIG. 1 is connected to multiple devices, as shown in FIG. 4C: if there may be multiple devices, then multiple APP-EPs 410-1 and 410-2 of FIG. 4C, which might receive the request. In embodiments of the inventive concept where only one device may be connected to LWB 135 of FIG. 1 (either because LWB 135 only includes one APP-EP 410 of FIGS. 4A-4B, or because only one SSD 125 of FIG. 1 is connected to LWB 135 of FIG. 1), the block 1515 may be omitted, as shown by dashed line 1520.

Once the appropriate device and the appropriate destination PF/VF has been identified, then at block 1525, LWB 135 of FIG. 1 may translate the request into a request for the identified PF/VF. This may involve, for example, address translation as described above with reference to FIG. 9 (and described below with reference to FIG. 16). At block 1530 (FIG. 15B), LWB 135 of FIG. 1 may send the translated request to the identified PF/VF on the identified device.

At block 1535, LWB 135 of FIG. 1 may receive a response from the identified PF/VF of the identified device. At block 1540, LWB 135 of FIG. 1 may map the PF/VF of the identified device to the PF exposed by endpoint 405 of FIGS. 4A-4C (which mapping may be performed using, for example, configuration table 435 of FIGS. 4A-4C). At block 1545, LWB 135 of FIG. 1 may translate the response into a response for host 135 of FIG. 1. Finally, at block 1550, LWB 135 of FIG. 1 may send the response back to the host as though from the exposed PF of endpoint 405 of FIGS. 4A-4C.

Figure 16:
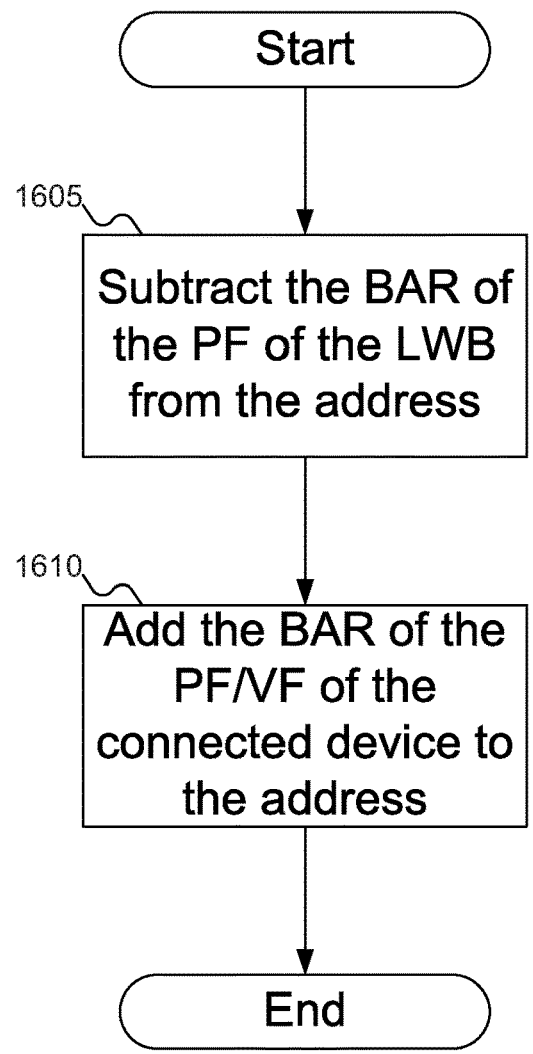
FIG. 16 shows a flowchart of an example procedure for the APP-EP and APP-RP of FIGS. 4A-4C to translate an address between the host of FIG. 1 and the SSD of FIG. 1.

FIG. 16 shows a flowchart of an example procedure for the APP-EP and APP-RP of FIGS. 4A-4C to translate an address between host 105 of FIG. 1 and SSD 125 of FIG. 1. In FIG. 16, at block 1605, APP-EP 410 of FIGS. 4A-4C may subtract a host BAR from the address included in the request from host 105 of FIG. 1, and at block 1610, APP-RP 415 of FIGS. 4A-4C may add a device BAR to the address determined in block 1605.

Note that the reverse address translation—from SSD 125 of FIG. 1 to host 105 of FIG. 1—may be omitted. SSD 125 of FIG. 1, like any such device, may receive the full address used by host 105 of FIG. 1. Therefore, the address provided by SSD 125 of FIG. 1 may be used to access a particular address within host 105 of FIG. 1 without translation. But if SSD 125 of FIG. 1 did not have the full address of host 105 of FIG. 1, address translation could be performed in reverse, with APP-RP 415 of FIGS. 4A-4C subtracting a device BAR from the address included in the request from SSD 125 of FIG. 1 and APP-EP 410 of FIGS. 4A-4C adding a host BAR to the address.

Figure 17:
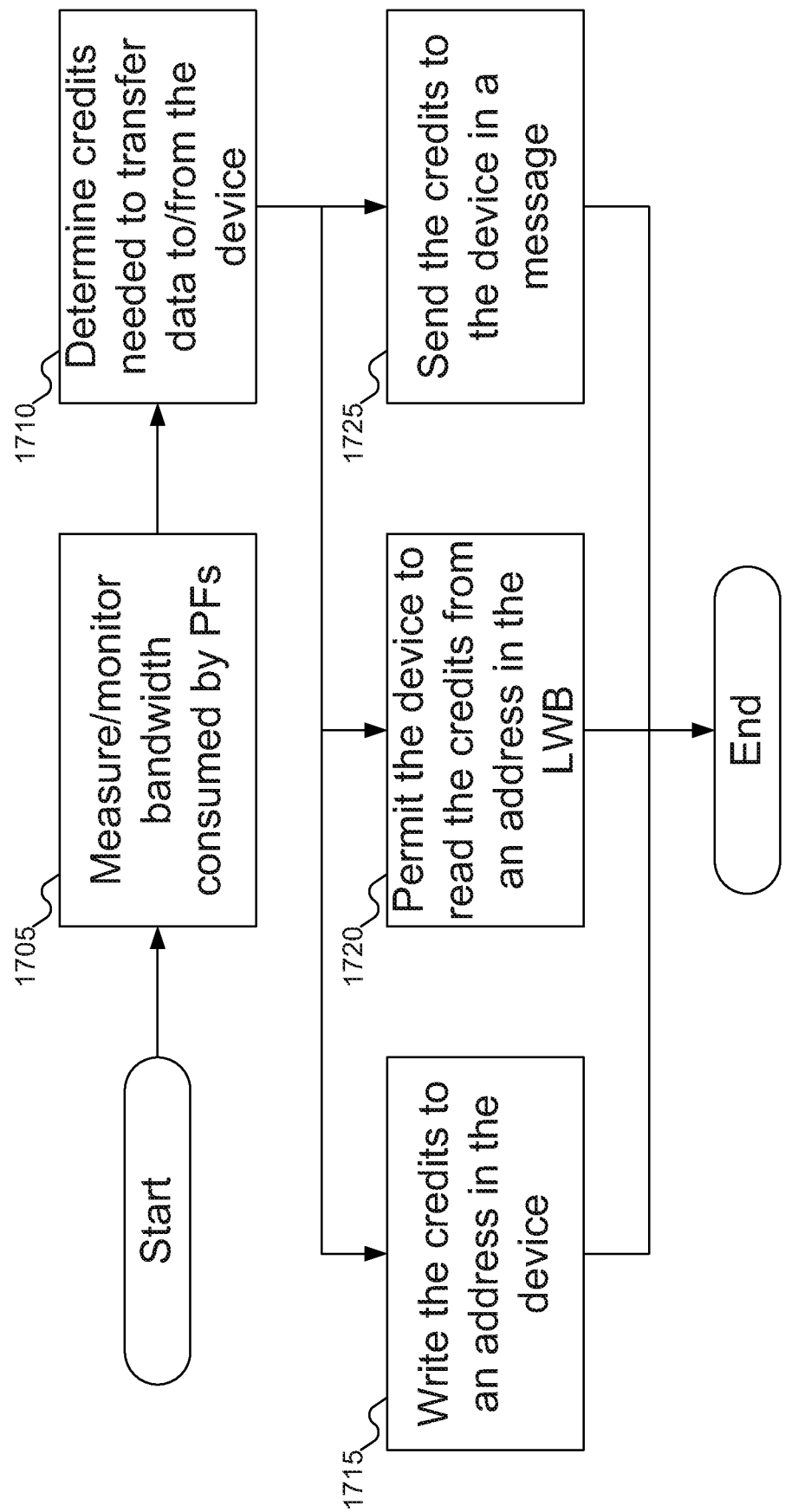
FIG. 17 shows a flowchart of an example procedure for the LWB of FIG. 1 to issue credits to the SSD of FIG. 1.

FIG. 17 shows a flowchart of an example procedure for LWB 135 of FIG. 1 to issue credits 1305 of FIG. 13 to SSD 125 of FIG. 1. In FIG. 17, at block 1705, LWB 135 of FIG. 1 may measure or monitor the bandwidth consumed by the individual PFs exposed by endpoint 405 of FIGS. 4A-4C. At block 1710, LWB 135 of FIG. 1 may determine credits 1305 of FIG. 13 to issue to SSD 125 of FIG. 1. These credits may be determined based on the bandwidth being consumed by the PFs exposed by endpoint 405 of FIGS. 4A-4C and the amount of data SSD 125 of FIG. 1 may need to transfer. SSD 125 of FIG. 1 may use these credits to transfer data either to SSD 125 of FIG. 1 or from SSD 125 of FIG. 1. At this point, there are multiple options for delivering credits 1305 of FIG. 13 to SSD 125 of FIG. 1. At block 1715, LWB 135 of FIG. 1 may write credits 1305 of FIG. 13 to an address in SSD 125 of FIG. 1. Alternatively, at block 1720, LWB 135 may write credits 1305 of FIG. 13 to an address in LWB 135 of FIG. 1, and SSD 125 of FIG. 1 may read credits 1305 of FIG. 13 from that address in LWB 135 of FIG. 1. Alternatively, at block 1725, LWB 135 of FIG. 1 may send a message to SSD 125 of FIG. 1, which may include credits 1305 of FIG. 13.

Figure 18:
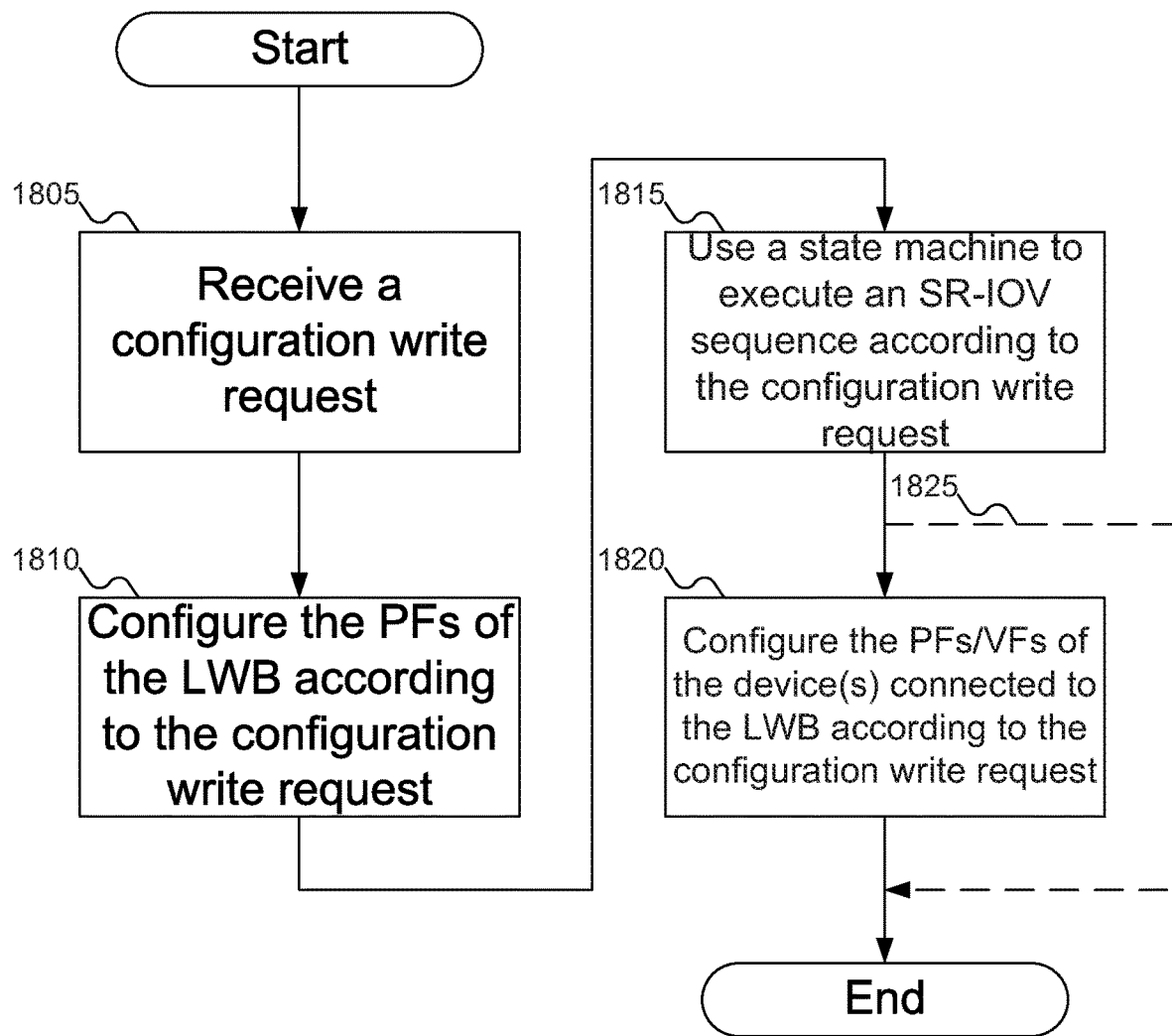
FIG. 18 shows a flowchart of an example procedure for the LWB of FIG. 1 to process a configuration write request.

FIG. 18 shows a flowchart of an example procedure for LWB 135 of FIG. 1 to process configuration write request 705 of FIG. 7. In FIG. 18, at block 1805, LWB 135 of FIG. 1 may receive configuration write request 705 of FIG. 7: configuration write request 705 of FIG. 7 may be received from either host 105 of FIG. 1 or SSD 125 of FIG. 1. At block 1810, LWB 135 of FIG. 1 (more specifically, configuration module 440 of FIGS. 4A-4C) may configure the PFs exposed by endpoint 405 of FIGS. 4A-4C as specified by configuration write request 705 of FIG. 7. At block 1815, LWB 135 of FIG. 1 may use state machine 510 of FIG. 5 and SR-IOV sequences 505 of FIG. 5 to perform this configuration. Finally, at block 1820, LWB 135 of FIG. 1 may ensure that the configuration of the PFs/VFs exposed by SSD 125 of FIG. 1 mirror the configuration of the PFs exposed by endpoint 405 of FIGS. 4A-4C: this may involve sending configuration write request 705 of FIG. 7 to SSD 125 of FIG. 1, as shown by dashed arrows 710 and 715. Since configuration write request 705 of FIG. 7 may not need to be send to SSD 125 of FIG. 1, block 1820 is optional, as shown by dashed line 1825.

Figure 19:
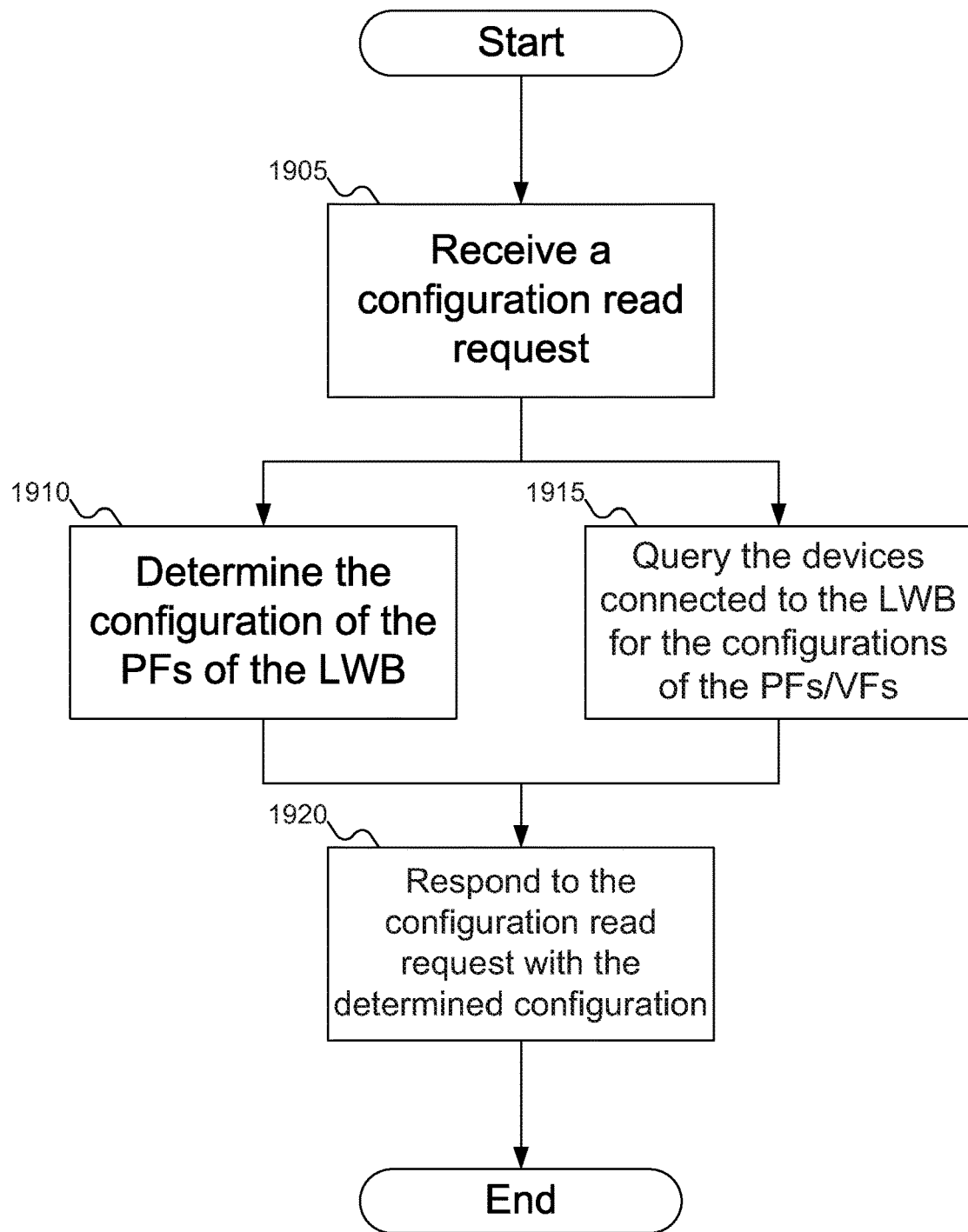
FIG. 19 shows a flowchart of an example procedure for the LWB of FIG. 1 to process a configuration read request.

FIG. 19 shows a flowchart of an example procedure for LWB 135 of FIG. 1 to process a configuration read request 805 of FIG. 8.

FIG. 19 shows a flowchart of an example procedure for LWB 135 of FIG. 1 to process configuration read request 805 of FIG. 8. In FIG. 19, at block 1905, LWB 135 of FIG. 1 may receive configuration read request 805 of FIG. 8: configuration read request 805 of FIG. 8 may be received from either host 105 of FIG. 1 or SSD 125 of FIG. 1 (although generally configuration read request 805 of FIG. 8 may be received from host 105 of FIG. 1). At this point, there are some alternatives. At block 1910, LWB 135 of FIG. 1 (more specifically, configuration module 440 of FIGS. 4A-4C) may determine the configuration of the PFs exposed by endpoint 405 of FIGS. 4A-4C. In embodiments of the inventive concept where block 1910 is used, there may be no need to query SSD 125 of FIG. 1 for the configuration of its exposed PFs/VFs, since the configuration of the PFs exposed by SSD 125 of FIG. 1 should mirror the configuration of the PFs exposed by endpoint 405 of FIGS. 4A-4C (although SSD 125 of FIG. 1 may be queried for the configuration of its exposed PFs/VFs as well). Alternatively, at block 1915, LWB 135 of FIG. 1 may deliver configuration read request 805 of FIG. 8 to SSD 125 of FIG. 1, as shown by dashed arrows 815 and 820 of FIG. 8, and may receive configuration information 810 of FIG. 8 in return (shown as dashed arrows 825 and 830 of FIG. 8). Either way, at block 1920 LWB 135 of FIG. 1 may return configuration information 810 of FIG. 8 to the requestor.

Figure 20:
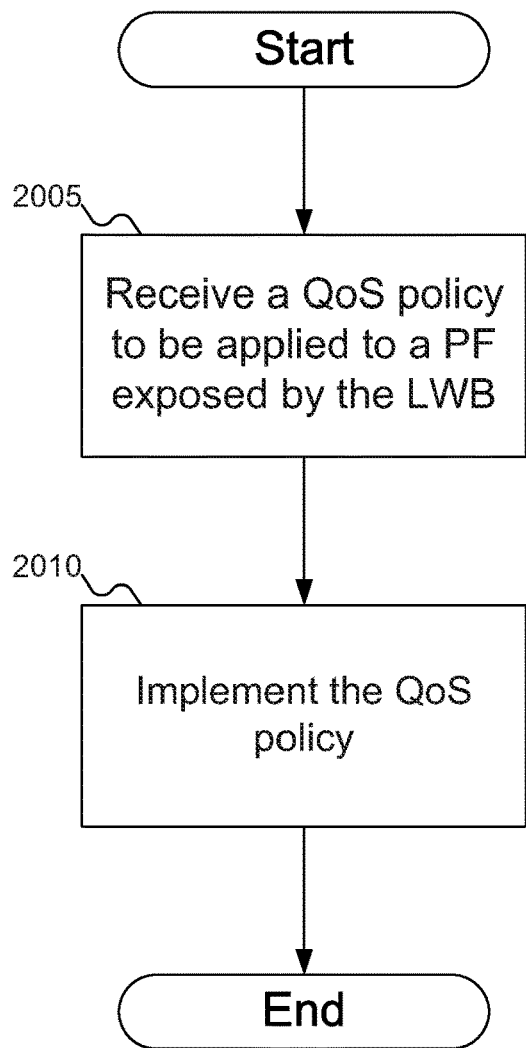
FIG. 20 shows a flowchart of an example procedure for the LWB of FIG. 1 to associate a QoS policy with a PF exposed by the LWB of FIG. 1.

FIG. 20 shows a flowchart of an example procedure for LWB 135 of FIG. 1 to associate QoS policy 1105 of FIG. 11 with a PF exposed by LWB 135 of FIG. 1. In FIG. 20, at block 2005, LWB 135 of FIG. 1 may receive QoS policy 1105 of FIG. 11 from a source, which may be either host 105 of FIG. 1 or SSD 125 of FIG. 1. Then, at block 2010, LWB 135 of FIG. 1 may associate the policy with the identified PF exposed by endpoint 405 of FIGS. 4A-4C and implement the policy as appropriate.

Figure 21:
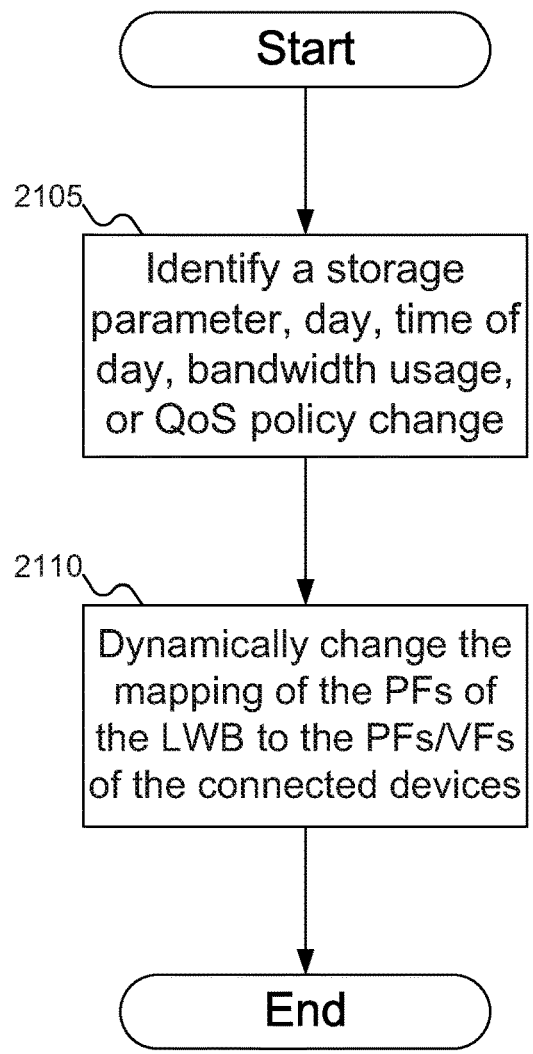
FIG. 21 shows a flowchart of an example procedure for the LWB of FIG. 1 to dynamically change the mapping of PFs exposed by the LWB of FIG. 1 to PFs/VFs exposed by the SSD of FIG. 1.

FIG. 21 shows a flowchart of an example procedure for LWB 135 of FIG. 1 to dynamically change the mapping of PFs exposed by LWB 135 of FIG. 1 to PFs/VFs exposed by SSD 125 of FIG. 1. In FIG. 21, at block 2105, LWB 135 of FIG. 1 may identify storage parameter 1005 of FIG. 1, day 1010 of FIG. 1, time of day 1015 of FIG. 10, bandwidth usage 1020 of FIG. 10, or QoS policy change 1025 of FIG. 10 that has changed. At block 2110, LWB 135 of FIG. 1 may dynamically change mapping 615 of FIG. 6 between PFs 605 of FIG. 6 and PFs/VFs 610 of FIG. 6 in response to the detected change.

Figure 22A:
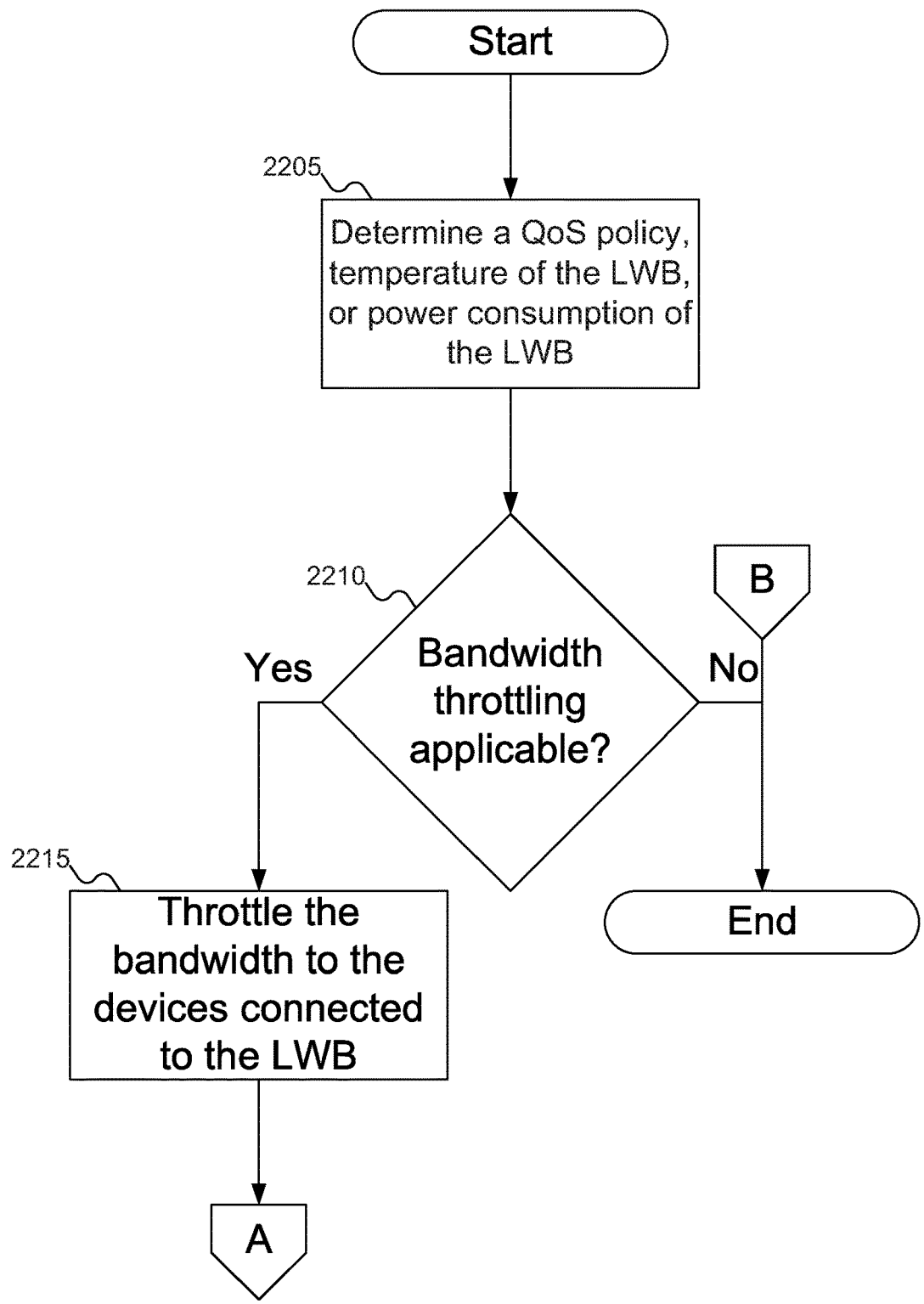
FIGS. 22A-22B show a flowchart of an example procedure for the LWB of FIG. 1 to perform bandwidth throttling.
Figure 22B:
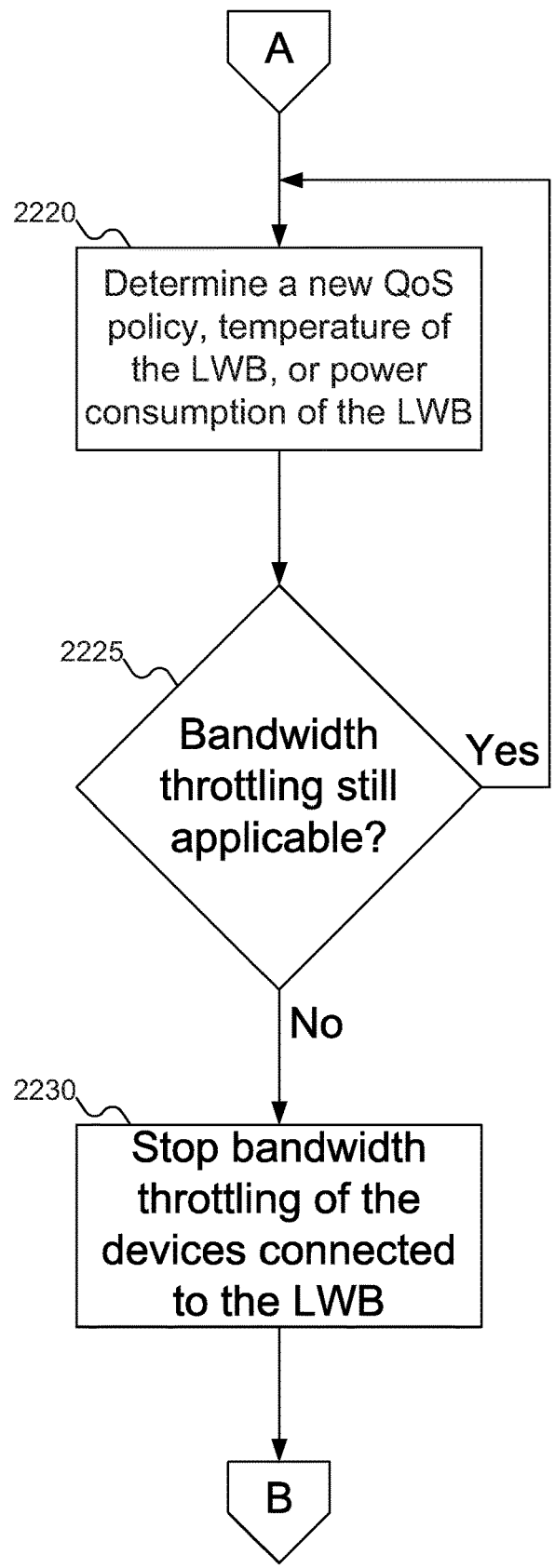

FIGS. 22A-22B show a flowchart of an example procedure for LWB 135 of FIG. 1 to perform bandwidth throttling. In FIG. 22A, at block 2205, LWB 135 of FIG. 1 may determine that based on QoS policy 1105 of FIG. 11, or the temperature or power consumption of LWB 135 of FIG. 1 or SSD 125 of FIG. 1. At block 2210, LWB 135 of FIG. 1 may determine whether bandwidth throttling is applicable: for example, by comparing the temperature or power consumption of LWB 135 of FIG. 1 or SSD 125 of FIG. 1 with a threshold stored in LWB 135 of FIG. 1.

If bandwidth throttling is applicable, then at block 2215, LWB 135 of FIG. 1 may throttle the bandwidth of SSD 125 of FIG. 1. This throttling may be accomplished by limiting the number of credits 1305 of FIG. 13 issued to SSD 125 of FIG. 1. Then, at block 2220 (FIG. 22B), LWB 135 of FIG. 1 may determine QoS policy 1105 of FIG. 11 (which may be the same QoS policy 1105 of FIG. 11 as triggered bandwidth throttling in block 2210 of FIG. 22A or a different QoS policy) or the temperature or power consumption of LWB 135 of FIG. 1 or SSD 125 of FIG. 1. At block 2225, LWB 135 of FIG. 1 may determine whether QoS policy 1105 of FIG. 11 or the new temperature or power consumption of LWB 135 of FIG. 1 or SSD 125 of FIG. 1 have reached a level at which bandwidth throttling is no longer needed. If bandwidth throttling is still applicable, then control may return to block 2220 to check again whether a change has occurred which might end bandwidth throttling. Otherwise, at block 2230 LWB 135 of FIG. 1 may stop bandwidth throttling.

In FIGS. 14A-22B, some embodiments of the invention are shown. But a person skilled in the art will recognize that other embodiments of the invention are also possible, by changing the order of the blocks, by omitting blocks, or by including links not shown in the drawings. All such variations of the flowcharts are considered to be embodiments of the invention, whether expressly described or not.

Embodiments of the inventive concept include technical advantages over conventional implementations. The Lightweight Bridge (LWB) may expose Physical Functions (PFs) to the host machine, which eliminates the need for the host machine to execute Single Root Input/Output Virtualization (SR-IOV) software to access Virtual Functions (VFs) of a device such as a Solid State Drive (SSD). Nor do the devices necessarily require any hardware modification, since the LWB may be a separate device and the devices do not require specific hardware to support multiple PFs. In fact, even if a single housing contains both the LWB and the device, and even if the LWB and the device are implemented on a shared printed circuit board, the inclusion of the LWB may not necessitate any hardware changes to the device, thus permitting existing SSDs (and other devices) to be used with the LWB and future SSDs (and other devices) to continue to offer VFs rather than include the hardware to support multiple PFs. (The devices may require some firmware update—for example, to support the use of credits to manage data transfer—but such an update may be carried out easily, even in the field for existing devices.) In addition, because the LWB may aggregate resources of multiple devices, the LWB may offer better overall performance than any individual device might offer.

The following discussion is intended to provide a brief, general description of a suitable machine or machines in which certain aspects of the invention can be implemented. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present invention can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Embodiments of the invention can include a tangible, non-transitory machine-readable medium comprising instructions executable by one or more processors, the instructions comprising instructions to perform the elements of the inventions as described herein.

Having described and illustrated the principles of the invention with reference to illustrated embodiments, it will be recognized that the illustrated embodiments can be modified in arrangement and detail without departing from such principles, and can be combined in any desired manner. And, although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms can reference the same or different embodiments that are combinable into other embodiments.

The foregoing illustrative embodiments are not to be construed as limiting the invention thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this invention as defined in the claims.

Embodiments of the invention can extend to the following statements, without limitation:

Statement 1. An embodiment of the inventive concept includes a lightweight bridge (LWB) circuit, comprising:

an endpoint to connect to a host, the endpoint exposing a plurality of Physical Functions (PFs), a root port to connect to a device, the device exposing to the root port at least one PF and at least one Virtual Function (VF); and an Application Layer-End Point (APP-EP) and an Application Layer-Root Port (APP-RP) to translate between the plurality of PFs exposed to the host and the at least one PF and the at least one VF exposed by the device, wherein the APP-EP and the APP-RP implement a mapping between the plurality of PFs exposed by the endpoint and the at least one PF and the at least one VF exposed by the device.

Statement 2. An embodiment of the inventive concept includes the LWB circuit according to statement 1, wherein the device includes a Solid State Drive (SSD).

Statement 3. An embodiment of the inventive concept includes the LWB circuit according to statement 1, wherein the device includes the LWB circuit.

Statement 4. An embodiment of the inventive concept includes the LWB circuit according to statement 1, wherein the LWB circuit is connected to the device.

Statement 5. An embodiment of the inventive concept includes the LWB circuit according to statement 1, wherein the APP-EP and the APP-RP may be implemented as a single component.

Statement 6. An embodiment of the inventive concept includes the LWB circuit according to statement 1, wherein the LWB circuit includes at least one of a Field Programmable Gate Array (FPGA), an Application-Specific Integrated circuit (ASIC), a general purpose processor, a Graphics Processing Unit (GPU), and a General Purpose GPU (GPGPU).

Statement 7. An embodiment of the inventive concept includes the LWB circuit according to statement 1, wherein:
the plurality of PFs include a plurality of Peripheral Component Interconnect Express (PCIe) PFs;
the at least one PF includes at least one PCIe PF; and
the at least one Virtual Function (VF) includes at least one PCIe VF.

Statement 8. An embodiment of the inventive concept includes the LWB circuit according to statement 7, wherein:
the APP-EP includes a PCIe APP-EP (PAPP-EP); and
the APP-RP includes a PCIe APP-RP (PAPP-RP).

Statement 9. An embodiment of the inventive concept includes the LWB circuit according to statement 1, further comprising a configuration manager to configure the APP-EP and the APP-RP.

Statement 10. An embodiment of the inventive concept includes the LWB circuit according to statement 9, wherein the APP-RP may include storage for a configuration table to store the mapping between the plurality of PFs exposed by the endpoint and the at least one PF and the at least one VF exposed by the device.

Statement 11. An embodiment of the inventive concept includes the LWB circuit according to statement 9, wherein the configuration manager may enumerate the at least one PF and the at least one VF exposed by the device and generate the plurality of PFs exposed by the endpoint based at least in part on the at least one PF and the at least one VF exposed by the device.

Statement 12. An embodiment of the inventive concept includes the LWB circuit according to statement 9, wherein the configuration manager may configure the device.

Statement 13. An embodiment of the inventive concept includes the LWB circuit according to statement 12, wherein the configuration manager may configure the device based at least in part on a configuration write request that may be received from the host at the endpoint.

Statement 14. An embodiment of the inventive concept includes the LWB circuit according to statement 9, wherein the APP-EP may intercept a configuration read request from the host and return configuration information to the host.

Statement 15. An embodiment of the inventive concept includes the LWB circuit according to statement 9, wherein the configuration manager may ensure that a first configuration of the device mirrors a second configuration of the endpoint.

Statement 16. An embodiment of the inventive concept includes the LWB circuit according to statement 9, wherein the configuration manager includes a Read Only Memory (ROM) and a state machine to implement Single Root Input/Output Virtualization (SR-IOV) sequences.

Statement 17. An embodiment of the inventive concept includes the LWB circuit according to statement 1, wherein:
the APP-EP may subtract a Base Address Register (BAR) of a PF exposed by the endpoint from an address received in a request from the host; and
the APP-RP may add a BAR of a VF exposed by the device to the address received from the APP-EP.

Statement 18. An embodiment of the inventive concept includes the LWB circuit according to statement 1, further comprising:
a second APP-EP and a second APP-RP;
a second device exposing at least one second PF and at least one second VF; and
a multiplexer/demultiplexer arranged connected to the endpoint and connected to each of the APP-EP and the second APP-EP,
wherein the second APP-EP and the APP-RP implement a second mapping between the plurality of PFs exposed by the endpoint and the at least one second PF and the at least one second VF exposed by the second device.

Statement 19. An embodiment of the inventive concept includes the LWB circuit according to statement 18, wherein the LWB circuit may offer aggregate resources of the device and the second device.

Statement 20. An embodiment of the inventive concept includes the LWB circuit according to statement 1, wherein the mapping between the plurality of PFs exposed by the endpoint and the at least one PF and the at least one VF exposed by the device may be dynamically changed.

Statement 21. An embodiment of the inventive concept includes the LWB circuit according to statement 20, wherein the mapping between the plurality of PFs exposed by the endpoint and the at least one PF and the at least one VF exposed by the device may be changed based at least in part on a storage parameter, a day, a time of day, a bandwidth usage, or a change in a Quality of Service (QoS) policy for at least one of the plurality of PFs exposed by the endpoint.

Statement 22. An embodiment of the inventive concept includes the LWB circuit according to statement 1, wherein the LWB circuit may implement bandwidth throttling.

Statement 23. An embodiment of the inventive concept includes the LWB circuit according to statement 22, wherein the LWB circuit may measure a bandwidth used by at least one of the plurality of PFs exposed by the endpoint.

Statement 24. An embodiment of the inventive concept includes the LWB circuit according to statement 22, wherein the LWB circuit may implement bandwidth throttling based at least in part on a policy set the host, a policy set by the device, a temperature of the LWB circuit, a power consumption of the LWB circuit, a temperature of the SSD, or a power consumption of the SSD.

Statement 25. An embodiment of the inventive concept includes the LWB circuit according to statement 24, wherein the LWB circuit further comprises storage for a threshold to trigger bandwidth throttling.

Statement 26. An embodiment of the inventive concept includes the LWB circuit according to statement 25, wherein the LWB circuit further comprises storage for a second threshold to trigger an end to bandwidth throttling.

Statement 27. An embodiment of the inventive concept includes the LWB circuit according to statement 22, wherein the LWB circuit may issue credits to the device for data transfer.

Statement 28. An embodiment of the inventive concept includes the LWB circuit according to statement 27, wherein the LWB circuit may write the credits to an address in the device.

Statement 29. An embodiment of the inventive concept includes the LWB circuit according to statement 27, wherein the device may read the credits from an address in the LWB circuit.

Statement 30. An embodiment of the inventive concept includes the LWB circuit according to statement 27, wherein the LWB circuit may send the credits to the device in a message.

Statement 31. An embodiment of the inventive concept includes the LWB circuit according to statement 22, wherein the LWB circuit may implement bandwidth throttling by introducing an inter-packet gap between a first data packet and a second data packet.

Statement 32. An embodiment of the inventive concept includes the LWB circuit according to statement 1, wherein the LWB circuit may implement a QoS policy on a PF of the plurality of PFs exposed by the device.

Statement 33. An embodiment of the inventive concept includes the LWB circuit according to statement 32, wherein the policy may be set by one of the host, a BMC, or the device.

Statement 34. An embodiment of the inventive concept includes the LWB circuit according to statement 1, wherein the LWB circuit may configure a capability of at least one of the plurality of PFs exposed by the endpoint based at least in part on a configuration write request received from the device.

Statement 35. An embodiment of the inventive concept includes a method, comprising:

enumerating at least one Physical Function (PF) exposed by a device using a root port of a Lightweight Bridge (LWB);

enumerating at least one Virtual Function (VF) exposed by the device using the root port of the LWB;

generating a plurality of PFs at an endpoint of the LWB for exposure to a host; and mapping the plurality of PFs at the endpoint of the LWB to the at least one PF and the at least one VF exposed by the device using an Application Layer-Endpoint (APP-EP) and an Application Layer-Root Port (APP-RP) of the LWB.

Statement 36. An embodiment of the inventive concept includes the method according to statement 35, wherein:

enumerating at least one Physical Function (PF) exposed by a device using a root port of a Lightweight Bridge (LWB) includes enumerating the at least one PF exposed by the device using the root port of the LWB at startup of the LWB; and enumerating at least one Virtual Function (VF) exposed by the device using the root port of the LWB includes enumerating the at least one VF exposed by the device using the root port of the LWB at startup of the LWB.

Statement 37. An embodiment of the inventive concept includes the method according to statement 35, wherein:

enumerating at least one Physical Function (PF) exposed by a device using a root port of a Lightweight Bridge (LWB) includes enumerating the at least one PF exposed by the device using the root port of the LWB when the device is connected to the LWB; and enumerating at least one Virtual Function (VF) exposed by the device using the root port of the LWB includes enumerating the at least one VF exposed by the device using the root port of the LWB when the device is connected to the LWB.

Statement 38. An embodiment of the inventive concept includes the method according to statement 35, wherein the device includes a Solid State Drive (SSD).

Statement 39. An embodiment of the inventive concept includes the method according to statement 35, wherein:

the plurality of PFs include a plurality of Peripheral Component Interconnect Express (PCIe) PFs;

the at least one Physical Function (PF) includes at least one PCIe PF; and the at least one Virtual Function (VF) includes at least one PCIe VF.

Statement 40. An embodiment of the inventive concept includes the method according to statement 39, wherein:

the APP-EP includes a PCIe APP-EP (PAPP-EP); and the APP-RP includes a PCIe APP-RP (PAPP-RP).

Statement 41. An embodiment of the inventive concept includes the method according to statement 35, further comprising:

receiving an enumeration from the host; and exposing the plurality of PFs at the endpoint of the LWB to the host.

Statement 42. An embodiment of the inventive concept includes the method according to statement 35, wherein enumerating at least one Physical Function (PF) exposed by a device using a root port of a Lightweight Bridge (LWB) includes enumerating at least one second PF exposed by a second device using a second root port of the LWB;

enumerating at least one Virtual Function (VF) exposed by the device using the root port of the LWB includes enumerating at least one second VF exposed by the second device using the second root port of the LWB; and mapping the plurality of PFs to the at least one PF and the at least one VF includes mapping the plurality of PFs to the at least one PF, the at least one VF, the at least one second PF, and the at least one second VF.

Statement 43. An embodiment of the inventive concept includes the method according to statement 42, further comprising:

determining resources of the device and the second device; and aggregating the resources of the device and the second device.

Statement 44. An embodiment of the inventive concept includes the method according to statement 35, further comprising:

receiving a request from the host at a PF of the plurality of PFs exposed by the endpoint;

mapping the PF of the plurality of PFs exposed by the endpoint of the LWB to a VF of the at least one VF exposed by the device;

translating the request from the PF of the plurality of PFs exposed by the endpoint to the VF of the at least one VF exposed by the device; and sending the request to the VF of the at least one VF exposed by the device.

Statement 45. An embodiment of the inventive concept includes the method according to statement 44, further comprising:

receiving a response to the request from the VF of the at least one VF exposed by the device;

mapping the VF of the at least one VF exposed by the device to the PF of the plurality of PFs exposed by the endpoint of the LWB;

translating the response from the VF of the at least one VF exposed by the device to the PF of the plurality of PFs exposed by the endpoint; and sending the response to the host via the PF of the plurality of PFs exposed by the endpoint of the LWB.

Statement 46. An embodiment of the inventive concept includes the method according to statement 45, wherein translating the response from the VF of the at least one VF exposed by the device to the PF of the plurality of PFs exposed by the endpoint includes modifying an address in the response based on a first Base Address Register (BAR) of the PF of the plurality of PFs exposed by the endpoint and a second BAR of the VF of the at least one VF exposed by the device.

Statement 47. An embodiment of the inventive concept includes the method according to statement 45, wherein mapping the VF of the at least one VF exposed by the device to the PF of the plurality of PFs exposed by the endpoint of the LWB includes mapping the VF of the at least one VF exposed by the device to the PF of the plurality of PFs exposed by the endpoint of the LWB using a configuration table in the APP-RP of the LWB.

Statement 48. An embodiment of the inventive concept includes the method according to statement 44, wherein translating the request from the PF of the plurality of PFs exposed by the endpoint to the VF of the at least one VF exposed by the device includes modifying an address in the request based on a first Base Address Register (BAR) of the PF of the plurality of PFs exposed by the endpoint and a second BAR of the VF of the at least one VF exposed by the device.

Statement 49. An embodiment of the inventive concept includes the method according to statement 44, wherein mapping the PF of the plurality of PFs exposed by the endpoint of the LWB to a VF of the at least one VF exposed by the device includes mapping the PF of the plurality of PFs exposed by the endpoint of the LWB to a VF of the at least one VF exposed by the device using a configuration table in the APP-RP of the LWB.

Statement 50. An embodiment of the inventive concept includes the method according to statement 44, wherein sending the request to the VF of the at least one VF exposed by the device includes:

selecting among the device and a second device, the second device exposing at least one second PF and at least one second VF based at least in part on the mapping of the PF of the plurality of PFs exposed by the endpoint of the LWB to a VF of the at least one VF exposed by the device; and sending the request to the APP-EP associated with the device.

Statement 51. An embodiment of the inventive concept includes the method according to statement 44, further comprising:

determining credits for a data transfer involving the device; and issuing the credits to the device.

Statement 52. An embodiment of the inventive concept includes the method according to statement 51, wherein issuing the credits to the device includes writing the credits to an address in the device.

Statement 53. An embodiment of the inventive concept includes the method according to statement 51, wherein issuing the credits to the device includes the device reading the credits from an address in the LWB.

Statement 54. An embodiment of the inventive concept includes the method according to statement 51, wherein issuing the credits to the device includes sending a message from the LWB to the device, the message including the credits.

Statement 55. An embodiment of the inventive concept includes the method according to statement 35, further comprising:

receiving a configuration write request; and configuring the plurality of PFs exposed by the endpoint of the LWB based at least in part on the configuration write request.

Statement 56. An embodiment of the inventive concept includes the method according to statement 55, further comprising configuring the at least one PF and the at least one VF exposed by the device to mirror a configuration of the plurality of PFs exposed by the endpoint of the LWB based at least in part on the configuration write request.

Statement 57. An embodiment of the inventive concept includes the method according to statement 55, wherein receiving a configuration write request includes receiving the configuration write request from the host.

Statement 58. An embodiment of the inventive concept includes the method according to statement 55, wherein receiving a configuration write request includes receiving the configuration write request from the device.

Statement 59. An embodiment of the inventive concept includes the method according to statement 58, wherein configuring the plurality of PFs exposed by the endpoint of the LWB based at least in part on the configuration write request includes configuring a capability of at least one of the plurality of PFs exposed by the endpoint based at least in part on the configuration write request received from the device.

Statement 60. An embodiment of the inventive concept includes the method according to statement 55, wherein configuring the plurality of PFs exposed by the endpoint of the LWB based at least in part on the configuration write request includes executing a Single Root Input/Output Virtualization (SR-IOV) sequence using a state machine.

Statement 61. An embodiment of the inventive concept includes the method according to statement 35, further comprising:

receiving a configuration read request;

determining a configuration of the at least one PF and the at least one VF of the device; and responding to the configuration read request with the configuration of the at least one PF and the at least one VF of the device.

Statement 62. An embodiment of the inventive concept includes the method according to statement 61, wherein determining a configuration of the at least one PF and the at least one VF of the device includes determining a configuration of the plurality of PFs exposed by the endpoint of the device.

Statement 63. An embodiment of the inventive concept includes the method according to statement 61, wherein determining a configuration of the at least one PF and the at least one VF of the device includes querying the device for the configuration of the at least one PF and the at least one VF of the device.

Statement 64. An embodiment of the inventive concept includes the method according to statement 61, wherein determining a configuration of the at least one PF and the at least one VF of the device includes not delivering the configuration read request to the device.

Statement 65. An embodiment of the inventive concept includes the method according to statement 35, further comprising dynamically changing the mapping of the plurality of PFs at the endpoint of the LWB to the at least one PF and the at least one VF exposed by the device using an Application Layer-Endpoint (APP-EP) and an Application Layer-Root Port (APP-RP) of the LWB.

Statement 66. An embodiment of the inventive concept includes the method according to statement 65, wherein dynamically changing the mapping of the plurality of PFs at the endpoint of the LWB to the at least one PF and the at least one VF exposed by the device using an Application Layer-Endpoint (APP-EP) and an Application Layer-Root Port (APP-RP) of the LWB includes dynamically changing the mapping of the plurality of PFs at the endpoint of the LWB to the at least one PF and the at least one VF exposed by the device using an Application Layer-Endpoint (APP-EP) and an Application Layer-Root Port (APP-RP) of the LWB based at least in part on a storage parameter, a day, a time of day, a bandwidth usage, or a change in a Quality of Service (QoS) policy for at least one of the plurality of PFs exposed by the endpoint of the LWB.

Statement 67. An embodiment of the inventive concept includes the method according to statement 35, further comprising throttling bandwidth for the device.

Statement 68. An embodiment of the inventive concept includes the method according to statement 67, further comprising measuring a bandwidth used by at least one of the plurality of PFs exposed by the endpoint.

Statement 69. An embodiment of the inventive concept includes the method according to statement 67, wherein throttling bandwidth for the device includes introducing an inter-packet gap between a first data packet and a second data packet.

Statement 70. An embodiment of the inventive concept includes the method according to statement 67, wherein throttling bandwidth for the device includes throttling bandwidth for the device based at least in part on one of a QoS policy set by the host, a QoS policy set by the device, a temperature of the LWB, a power consumption of the LWB, a temperature of the SSD, or a power consumption of the SSD.

Statement 71. An embodiment of the inventive concept includes the method according to statement 70, wherein throttling bandwidth for the device includes throttling bandwidth for the device based at least in part on one of a QoS policy set by the host, a QoS policy set by the device, a temperature of the LWB, a power consumption of the LWB, a temperature of the SSD, or a power consumption of the SSD includes throttling bandwidth for the device based at least in part on one of the temperature of the LWB, the power consumption of the LWB, the temperature of the SSD, or the power consumption of the SSD exceeding a threshold.

Statement 72. An embodiment of the inventive concept includes the method according to statement 71, further comprising ending throttling bandwidth for the device based at least in part on one of the temperature of the LWB, the power consumption of the LWB, the temperature of the SSD, or the power consumption of the SSD dropping below a second threshold.

Statement 73. An embodiment of the inventive concept includes the method according to statement 35, further comprising:
receiving a QoS policy for a PF of the plurality of PFs exposed by the endpoint of the LWB; and
implementing the QoS policy for the PF of the plurality of PFs exposed by the endpoint of the LWB.

Statement 74. An embodiment of the inventive concept includes the method according to statement 73, wherein receiving a QoS policy for a PF of the plurality of PFs exposed by the endpoint of the LWB includes receiving the QoS policy for the PF of the plurality of PFs exposed by the endpoint of the LWB from one of the host or the device.

Statement 75. An embodiment of the inventive concept includes an article, comprising a non-transitory storage medium, the non-transitory storage medium having stored thereon instructions that, when executed by a machine, result in:
enumerating at least one Physical Function (PF) exposed by a device using a root port of a Lightweight Bridge (LWB);
enumerating at least one Virtual Function (VF) exposed by the device using the root port of the LWB;
generating a plurality of PFs at an endpoint of the LWB for exposure to a host; and
mapping the plurality of PFs at the endpoint of the LWB to the at least one PF and the at least one VF exposed by the device using an Application Layer-Endpoint (APP-EP) and an Application Layer-Root Port (APP-RP) of the LWB.

Statement 76. An embodiment of the inventive concept includes the article according to statement 75, wherein:
enumerating at least one Physical Function (PF) exposed by a device using a root port of a Lightweight Bridge (LWB) includes enumerating the at least one PF exposed by the device using the root port of the LWB at startup of the LWB; and
enumerating at least one Virtual Function (VF) exposed by the device using the root port of the LWB includes enumerating the at least one VF exposed by the device using the root port of the LWB at startup of the LWB.

Statement 77. An embodiment of the inventive concept includes the article according to statement 75, wherein:
enumerating at least one Physical Function (PF) exposed by a device using a root port of a Lightweight Bridge (LWB) includes enumerating the at least one PF exposed by the device using the root port of the LWB when the device is connected to the LWB; and
enumerating at least one Virtual Function (VF) exposed by the device using the root port of the LWB includes enumerating the at least one VF exposed by the device using the root port of the LWB when the device is connected to the LWB.

Statement 78. An embodiment of the inventive concept includes the article according to statement 75, wherein the device includes a Solid State Drive (SSD).

Statement 79. An embodiment of the inventive concept includes the article according to statement 75, wherein:
the plurality of PFs include a plurality of Peripheral Component Interconnect Express (PCIe) PFs;
the at least one Physical Function (PF) includes at least one PCIe PF; and
the at least one Virtual Function (VF) includes at least one PCIe VF.

Statement 80. An embodiment of the inventive concept includes the article according to statement 79, wherein:
the APP-EP includes a PCIe APP-EP (PAPP-EP); and
the APP-RP includes a PCIe APP-RP (PAPP-RP).

Statement 81. An embodiment of the inventive concept includes the article according to statement 75, the non-transitory storage medium having stored thereon further instructions that, when executed by the machine, result in:
receiving an enumeration from the host; and
exposing the plurality of PFs at the endpoint of the LWB to the host.

Statement 82. An embodiment of the inventive concept includes the article according to statement 75, wherein
enumerating at least one Physical Function (PF) exposed by a device using a root port of a Lightweight Bridge (LWB) includes enumerating at least one second PF exposed by a second device using a second root port of the LWB;
enumerating at least one Virtual Function (VF) exposed by the device using the root port of the LWB includes enumerating at least one second VF exposed by the second device using the second root port of the LWB; and mapping the plurality of PFs to the at least one PF and the at least one VF includes mapping the plurality of PFs to the at least one PF, the at least one VF, the at least one second PF, and the at least one second VF.

Statement 83. An embodiment of the inventive concept includes the article according to statement 82, the non-transitory storage medium having stored thereon further instructions that, when executed by the machine, result in:

determining resources of the device and the second device; and aggregating the resources of the device and the second device.

Statement 84. An embodiment of the inventive concept includes the article according to statement 75, the non-transitory storage medium having stored thereon further instructions that, when executed by the machine, result in:

receiving a request from the host at a PF of the plurality of PFs exposed by the endpoint;

mapping the PF of the plurality of PFs exposed by the endpoint of the LWB to a VF of the at least one VF exposed by the device;

translating the request from the PF of the plurality of PFs exposed by the endpoint to the VF of the at least one VF exposed by the device; and sending the request to the VF of the at least one VF exposed by the device.

Statement 85. An embodiment of the inventive concept includes the article according to statement 84, the non-transitory storage medium having stored thereon further instructions that, when executed by the machine, result in:

receiving a response to the request from the VF of the at least one VF exposed by the device;

mapping the VF of the at least one VF exposed by the device to the PF of the plurality of PFs exposed by the endpoint of the LWB;

translating the response from the VF of the at least one VF exposed by the device to the PF of the plurality of PFs exposed by the endpoint; and sending the response to the host via the PF of the plurality of PFs exposed by the endpoint of the LWB.

Statement 86. An embodiment of the inventive concept includes the article according to statement 85, wherein translating the response from the VF of the at least one VF exposed by the device to the PF of the plurality of PFs exposed by the endpoint includes modifying an address in the response based on a first Base Address Register (BAR) of the PF of the plurality of PFs exposed by the endpoint and a second BAR of the VF of the at least one VF exposed by the device.

Statement 87. An embodiment of the inventive concept includes the article according to statement 85, wherein mapping the VF of the at least one VF exposed by the device to the PF of the plurality of PFs exposed by the endpoint of the LWB includes mapping the VF of the at least one VF exposed by the device to the PF of the plurality of PFs exposed by the endpoint of the LWB using a configuration table in the APP-RP of the LWB.

Statement 88. An embodiment of the inventive concept includes the article according to statement 84, wherein translating the request from the PF of the plurality of PFs exposed by the endpoint to the VF of the at least one VF exposed by the device includes modifying an address in the request based on a first Base Address Register (BAR) of the PF of the plurality of PFs exposed by the endpoint and a second BAR of the VF of the at least one VF exposed by the device.

Statement 89. An embodiment of the inventive concept includes the article according to statement 84, wherein mapping the PF of the plurality of PFs exposed by the endpoint of the LWB to a VF of the at least one VF exposed by the device includes mapping the PF of the plurality of PFs exposed by the endpoint of the LWB to a VF of the at least one VF exposed by the device using a configuration table in the APP-RP of the LWB.

Statement 90. An embodiment of the inventive concept includes the article according to statement 84, wherein sending the request to the VF of the at least one VF exposed by the device includes:

selecting among the device and a second device, the second device exposing at least one second PF and at least one second VF based at least in part on the mapping of the PF of the plurality of PFs exposed by the endpoint of the LWB to a VF of the at least one VF exposed by the device; and sending the request to the APP-EP associated with the device.

Statement 91. An embodiment of the inventive concept includes the article according to statement 84, the non-transitory storage medium having stored thereon further instructions that, when executed by the machine, result in:

determining credits for a data transfer involving the device; and issuing the credits to the device.

Statement 92. An embodiment of the inventive concept includes the article according to statement 91, wherein issuing the credits to the device includes writing the credits to an address in the device.

Statement 93. An embodiment of the inventive concept includes the article according to statement 91, wherein issuing the credits to the device includes the device reading the credits from an address in the LWB.

Statement 94. An embodiment of the inventive concept includes the article according to statement 91, wherein issuing the credits to the device includes sending a message from the LWB to the device, the message including the credits.

Statement 95. An embodiment of the inventive concept includes the article according to statement 75, the non-transitory storage medium having stored thereon further instructions that, when executed by the machine, result in:

receiving a configuration write request; and configuring the plurality of PFs exposed by the endpoint of the LWB based at least in part on the configuration write request.

Statement 96. An embodiment of the inventive concept includes the article according to statement 95, the non-transitory storage medium having stored thereon further instructions that, when executed by the machine, result in configuring the at least one PF and the at least one VF exposed by the device to mirror a configuration of the plurality of PFs exposed by the endpoint of the LWB based at least in part on the configuration write request.

Statement 97. An embodiment of the inventive concept includes the article according to statement 95, wherein receiving a configuration write request includes receiving the configuration write request from the host.

Statement 98. An embodiment of the inventive concept includes the article according to statement 95, wherein receiving a configuration write request includes receiving the configuration write request from the device.

Statement 99. An embodiment of the inventive concept includes the article according to statement 98, wherein configuring the plurality of PFs exposed by the endpoint of the LWB based at least in part on the configuration write request includes configuring a capability of at least one of the plurality of PFs exposed by the endpoint based at least in part on the configuration write request received from the device.

Statement 100. An embodiment of the inventive concept includes the article according to statement 95, wherein configuring the plurality of PFs exposed by the endpoint of the LWB based at least in part on the configuration write request includes executing a Single Root Input/Output Virtualization (SR-IOV) sequence using a state machine.

Statement 101. An embodiment of the inventive concept includes the article according to statement 75, the non-transitory storage medium having stored thereon further instructions that, when executed by the machine, result in:
receiving a configuration read request;
determining a configuration of the at least one PF and the at least one VF of the device; and
responding to the configuration read request with the configuration of the at least one PF and the at least one VF of the device.

Statement 102. An embodiment of the inventive concept includes the article according to statement 101, wherein determining a configuration of the at least one PF and the at least one VF of the device includes determining a configuration of the plurality of PFs exposed by the endpoint of the device.

Statement 103. An embodiment of the inventive concept includes the article according to statement 101, wherein determining a configuration of the at least one PF and the at least one VF of the device includes querying the device for the configuration of the at least one PF and the at least one VF of the device.

Statement 104. An embodiment of the inventive concept includes the article according to statement 101, wherein determining a configuration of the at least one PF and the at least one VF of the device includes not delivering the configuration read request to the device.

Statement 105. An embodiment of the inventive concept includes the article according to statement 75, the non-transitory storage medium having stored thereon further instructions that, when executed by the machine, result in dynamically changing the mapping of the plurality of PFs at the endpoint of the LWB to the at least one PF and the at least one VF exposed by the device using an Application Layer-Endpoint (APP-EP) and an Application Layer-Root Port (APP-RP) of the LWB.

Statement 106. An embodiment of the inventive concept includes the article according to statement 105, wherein dynamically changing the mapping of the plurality of PFs at the endpoint of the LWB to the at least one PF and the at least one VF exposed by the device using an Application Layer-Endpoint (APP-EP) and an Application Layer-Root Port (APP-RP) of the LWB includes dynamically changing the mapping of the plurality of PFs at the endpoint of the LWB to the at least one PF and the at least one VF exposed by the device using an Application Layer-Endpoint (APP-EP) and an Application Layer-Root Port (APP-RP) of the LWB based at least in part on a storage parameter, a day, a time of day, a bandwidth usage, or a change in a Quality of Service (QoS) policy for at least one of the plurality of PFs exposed by the endpoint of the LWB.

Statement 107. An embodiment of the inventive concept includes the article according to statement 75, the non-transitory storage medium having stored thereon further instructions that, when executed by the machine, result in throttling bandwidth for the device.

Statement 108. An embodiment of the inventive concept includes the article according to statement 107, further comprising measuring a bandwidth used by at least one of the plurality of PFs exposed by the endpoint.

Statement 109. An embodiment of the inventive concept includes the article according to statement 107, wherein throttling bandwidth for the device includes introducing an inter-packet gap between a first data packet and a second data packet.

Statement 110. An embodiment of the inventive concept includes the article according to statement 107, wherein throttling bandwidth for the device includes throttling bandwidth for the device based at least in part on one of a QoS policy set by the host, a QoS policy set by the device, a temperature of the LWB, a power consumption of the LWB, a temperature of the SSD, or a power consumption of the SSD.

Statement 111. An embodiment of the inventive concept includes the article according to statement 110, wherein throttling bandwidth for the device includes throttling bandwidth for the device based at least in part on one of a QoS policy set by the host, a QoS policy set by the device, a temperature of the LWB, a power consumption of the LWB, a temperature of the SSD, or a power consumption of the SSD includes throttling bandwidth for the device based at least in part on one of the temperature of the LWB, the power consumption of the LWB, the temperature of the SSD, or the power consumption of the SSD exceeding a threshold.

Statement 112. An embodiment of the inventive concept includes the article according to statement 111, the non-transitory storage medium having stored thereon further instructions that, when executed by the machine, result in ending throttling bandwidth for the device based at least in part on one of the temperature of the LWB, the power consumption of the LWB, the temperature of the SSD, or the power consumption of the SSD dropping below a second threshold.

Statement 113. An embodiment of the inventive concept includes the article according to statement 75, the non-transitory storage medium having stored thereon further instructions that, when executed by the machine, result in:
receiving a QoS policy for a PF of the plurality of PFs exposed by the endpoint of the LWB; and
implementing the QoS policy for the PF of the plurality of PFs exposed by the endpoint of the LWB.

Statement 114. An embodiment of the inventive concept includes the article according to statement 75, wherein receiving a QoS policy for a PF of the plurality of PFs exposed by the endpoint of the LWB includes receiving the QoS policy for the PF of the plurality of PFs exposed by the endpoint of the LWB from one of the host or the device.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:
1. A bridge circuit, comprising:
an endpoint to connect to a host, the endpoint exposing a first Physical Function (PF) and a second PF;

a root port to connect to a device, the device exposing to the root port a third PF and a Virtual Function (VF); and an Application Layer-End Point (APP-EP) and an Application Layer-Root Port (APP-RP) to translate between the first PF and the second PF exposed to the host and the third PF and the VF exposed by the device, wherein the APP-EP and the APP-RP implement a mapping between the first PF and the second PF exposed by the endpoint and the third PF and the VF exposed by the device.

2. The bridge circuit according to claim 1, further comprising a configuration manager to configure the APP-EP and the APP-RP.

3. The bridge circuit according to claim 2, wherein the APP-RP may include storage for a configuration table to store the mapping between the first PF and the second PF exposed by the endpoint and the third PF and the VF exposed by the device.

4. The bridge circuit according to claim 2, wherein the configuration manager may enumerate the third PF and the VF exposed by the device and generate the first PF and the second PF exposed by the endpoint based at least in part on the third PF and the VF exposed by the device.

5. The bridge circuit according to claim 2, wherein the configuration manager may ensure that a first configuration of the device mirrors a second configuration of the endpoint.

6. The bridge circuit according to claim 2, wherein the configuration manager includes a Read Only Memory (ROM) and a state machine to implement Single Root Input/Output Virtualization (SR-IOV) sequences.

7. The bridge circuit according to claim 1, further comprising:
a second APP-EP and a second APP-RP;
a second device exposing a fourth PF and a second VF; and
a multiplexer/demultiplexer arranged connected to the endpoint and connected to each of the APP-EP and the second APP-EP,
wherein the second APP-EP and the APP-RP implement a second mapping between a fifth PF and a sixth PF exposed by the endpoint and the fourth PF and the second VF exposed by the second device.

8. The bridge circuit according to claim 7, wherein the bridge circuit may offer aggregate resources of the device and the second device.

9. The bridge circuit according to claim 1, wherein the bridge circuit may implement bandwidth throttling.

10. The bridge circuit according to claim 9, wherein the bridge circuit may implement bandwidth throttling based at least in part on a policy set the host, a policy set by the device, a temperature of the bridge circuit, a power consumption of the bridge circuit, a temperature of the device, or a power consumption of the device.

11. The bridge circuit according to claim 1, wherein the bridge circuit may implement a QoS policy on the first PF exposed by the device.

12. A method, comprising:
enumerating a first Physical Function (PF) exposed by a device using a root port of a bridge;
enumerating a Virtual Function (VF) exposed by the device using the root port of the bridge;
generating a second PF and a third PF at an endpoint of the bridge for exposure to a host; and
mapping the second PF and the third PF at the endpoint of the bridge to the first PF and the VF exposed by the device using an Application Layer-Endpoint (APP-EP) and an Application Layer-Root Port (APP-RP) of the bridge,
wherein the mapping between the second PF and the third PF by the endpoint of the bridge to the first PF and the VF exposed by the device is a stored mapping.

13. The method according to claim 12, wherein enumerating the first PF exposed by the device using the root port of the bridge includes enumerating a fourth PF exposed by a second device using a second root port of the bridge;
enumerating the VF exposed by the device using the root port of the bridge includes enumerating a second VF exposed by the second device using the second root port of the bridge; and
mapping the second PF and the third PF to the first PF and the VF includes mapping the second PF, the third PF, a fifth PF, and a sixth PF to the first PF, the VF, the fourth PF, and the second VF.

14. The method according to claim 13, further comprising:
determining resources of the device and the second device; and
aggregating the resources of the device and the second device.

15. The method according to claim 12, further comprising:
receiving a request from the host at the second PF exposed by the endpoint;
mapping the second PF exposed by the endpoint of the bridge to the VF exposed by the device;
translating the request from the second PF exposed by the endpoint to the VF exposed by the device; and
sending the request to the VF exposed by the device.

16. The method according to claim 15, further comprising:
determining credits for a data transfer involving the device; and
issuing the credits to the device.

17. The method according to claim 12, further comprising throttling bandwidth for the device.

18. The method according to claim 17, wherein throttling bandwidth for the device includes throttling bandwidth for the device based at least in part on one of a QoS policy set by the host, a QoS policy set by the device, a temperature of the bridge, a power consumption of the bridge, a temperature of the device, or a power consumption of the device.

19. An article, comprising a non-transitory storage medium, the non-transitory storage medium having stored thereon instructions that, when executed by a machine, result in:
enumerating a first Physical Function (PF) exposed by a device using a root port of a bridge;
enumerating a Virtual Function (VF) exposed by the device using the root port of the bridge;
generating a second PF and a third PF at an endpoint of the bridge for exposure to a host; and
mapping the second PF and the third PF at the endpoint of the bridge to the first PF and the VF exposed by the device using an Application Layer-Endpoint (APP-EP) and an Application Layer-Root Port (APP-RP) of the bridge,
wherein the mapping between the second PF and the third PF by the endpoint of the bridge to the first PF and the VF exposed by the device is a stored mapping.

20. The article according to claim 19, wherein enumerating the first PF exposed by the device using the root port of the bridge includes enumerating a fourth PF exposed by a second device using a second root port of the bridge;
   enumerating the VF exposed by the device using the root port of the bridge includes enumerating a second VF exposed by the second device using the second root port of the bridge; and
   mapping the second PF and the third PF to the first PF and the VF includes mapping the second PF, the third PF, a fifth PF, and a sixth PF to the first PF, the VF, the fourth PF, and the second VF.

* * * * *